United States Patent
Saeki

(10) Patent No.: US 7,132,752 B2
(45) Date of Patent: Nov. 7, 2006

(54) SEMICONDUCTOR CHIP AND SEMICONDUCTOR DEVICE INCLUDING LAMINATION OF SEMICONDUCTOR CHIPS

(75) Inventor: Yoshihiro Saeki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 59 days.

(21) Appl. No.: 10/766,944

(22) Filed: Jan. 30, 2004

(65) Prior Publication Data

US 2005/0093167 A1    May 5, 2005

(30) Foreign Application Priority Data

Oct. 31, 2003  (JP)  .............................. 2003-372265

(51) Int. Cl.
  H01L 23/495  (2006.01)
  H01L 23/31   (2006.01)
  H01L 23/28   (2006.01)
  H01L 23/48   (2006.01)
  H01L 23/52   (2006.01)

(52) U.S. Cl. .............................. 257/777; 257/E25.013; 257/E23.125; 257/E23.142; 257/E23.052; 257/E23.036; 257/E23.079; 257/686; 257/685; 257/723; 257/786; 257/202; 257/203; 257/207; 257/208; 257/210; 257/211; 257/698; 257/691; 257/784

(58) Field of Classification Search ................ 257/777, 257/686, 685, 723, 784, 786, 676, 202, 203, 257/207, 208, 210, 211, 698, 690–693, E25.013, 257/E23.125, E23.142, E23.052, E23.036
See application file for complete search history.

(56) References Cited

U.S. PATENT DOCUMENTS

| 5,615,475 A | * | 4/1997 | Burns ........................... 29/827 |
| 5,696,031 A | * | 12/1997 | Wark ............................. 438/4 |
| 5,907,769 A | * | 5/1999 | Corisis ......................... 438/123 |

(Continued)

FOREIGN PATENT DOCUMENTS

JP    2001-007278    1/2001

(Continued)

*Primary Examiner*—Alexander Oscar Williams
(74) *Attorney, Agent, or Firm*—Nixon Peabody LLP; Donald R. Studebaker

(57) ABSTRACT

To prevent short-circuit due to contact of bonding wires each other and to make a semiconductor device compact. A semiconductor chip with a rectangular main surface may comprise: a first side composing the main surface; a second side opposed to the first side; a main electrode pad group composed of a plurality of main electrode pads, which plurality of main electrode pads is arranged on the main surface along the first side; a first electrode pad group composed of a plurality of first electrode pads, which plurality of first electrode pads is arranged between the first side and the main electrode pad group; a second electrode pad group composed of a plurality of second electrode pads, which plurality of second electrode pads is arranged on the main surface along the second side; a first interconnection connecting the main electrode pad with the first electrode pad; and a second interconnection connecting the main electrode pad with the second electrode pad.

10 Claims, 18 Drawing Sheets

U.S. PATENT DOCUMENTS

| | | | |
|---|---|---|---|
| 6,130,474 A * | 10/2000 | Corisis | 257/676 |
| 6,359,340 B1 * | 3/2002 | Lin et al. | 257/777 |
| 6,433,421 B1 | 8/2002 | Masuda et al. | |
| 6,617,692 B1 * | 9/2003 | Schoenfeld | 257/776 |
| 6,836,002 B1 * | 12/2004 | Chikawa et al. | 257/666 |
| 6,836,010 B1 * | 12/2004 | Saeki | 257/694 |
| 2002/0045290 A1 * | 4/2002 | Ball | 438/106 |
| 2003/0153122 A1 * | 8/2003 | Brooks | 438/107 |
| 2005/0087856 A1 * | 4/2005 | Joiner et al. | 257/690 |

FOREIGN PATENT DOCUMENTS

| | | |
|---|---|---|
| JP | 2001-196529 | 7/2001 |
| JP | 2001-298150 | 10/2001 |
| JP | 2002-110898 | 4/2002 |

\* cited by examiner

SEMICONDUCTOR CHIP ACCORDING TO FIRST EMBODIMENT

EXAMPLE OF LAMINATION OF SEMICONDUCTOR CHIPS ACCORDING TO FIRST EMBODIMENT

EXAMPLE OF PACKAGING OF SEMICONDUCTOR CHIPS ACCORDING TO FIRST EMBODIMENT

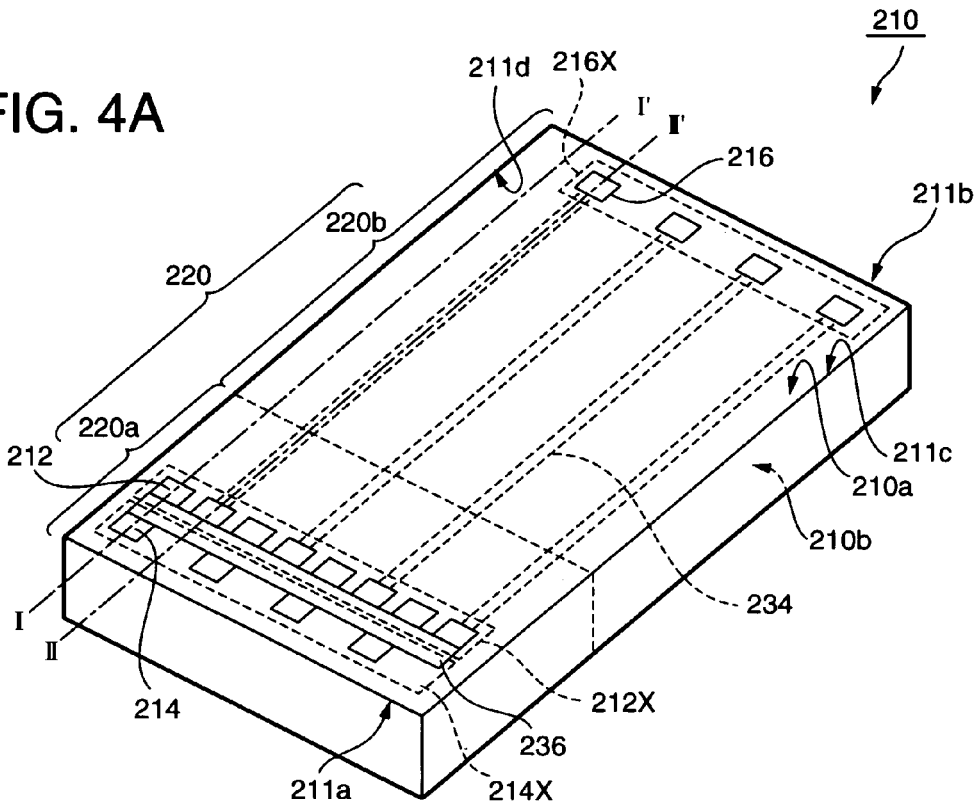
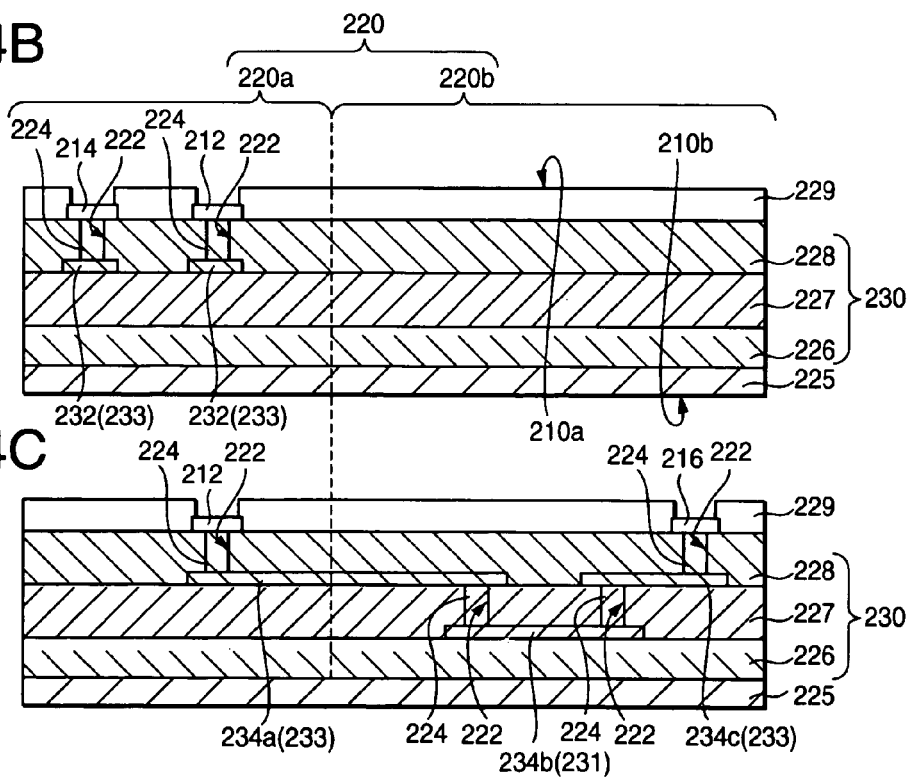
SEMICONDUCTOR CHIP ACCORDING TO SECOND EMBODIMENT

EXPLANATORY VIEW OF CONVERSION CIRCUIT ACCORDING TO SECOND EMBODIMENT

EXAMPLE OF LAMINATION OF SEMICONDUCTOR CHIPS ACCORDING TO SECOND EMBODIMENT

PARTIAL ENLARGED VIEW OF AREA H

EXAMPLE OF PACKAGING OF SEMICONDUCTOR CHIPS ACCORDING TO SECOND EMBODIMENT

SEMICONDUCTOR CHIP ACCORDING TO THIRD EMBODIMENT

EXAMPLE OF LAMINATION OF SEMICONDUCTOR CHIPS ACCORDING TO THIRD EMBODIMENT

EXAMPLE OF PACKAGING OF SEMICONDUCTOR CHIPS ACCORDING TO THIRD EMBODIMENT

SEMICONDUCTOR CHIP ACCORDING TO FOURTH EMBODIMENT

EXAMPLE OF LAMINATION OF SEMICONDUCTOR 400
CHIPS ACCORDING TO FOURTH EMBODIMENT

EXAMPLE OF PACKAGING OF SEMICONDUCTOR CHIPS ACCORDING TO FOURTH EMBODIMENT

SEMICONDUCTOR CHIP ACCORDING TO FIFTH EMBODIMENT

EXAMPLE OF LAMINATION OF SEMICONDUCTOR CHIPS ACCORDING TO FIFTH EMBODIMENT

EXAMPLE OF LAMINATION OF SEMICONDUCTOR CHIPS ACCORDING TO FIFTH EMBODIMENT

EXAMPLE OF PACKAGING OF SEMICONDUCTOR CHIPS ACCORDING TO FIFTH EMBODIMENT

SEMICONDUCTOR CHIP AND SEMICONDUCTOR DEVICE INCLUDING LAMINATION OF SEMICONDUCTOR CHIPS

BACKGROUND OF THE INVENTION

1. Field of the Invention

The present invention relates to a semiconductor chip and a semiconductor device, and particularly relates to a plurality of semiconductor chips capable of being laminated and a semiconductor device composed of the lamination of these plural semiconductor chips. This is counterpart of and claims priority to Japanese Patent Application No. 372265/2003 filed on Oct. 31, 2003, which is herein incorporated by reference.

2. Description of the Related Art

With the aim of having a multifunctional semiconductor, a semiconductor chip laminated type package with a plurality of semiconductor chips laminated has been known.

As an example of such a semiconductor chip laminated type package, there is a stack type multichip package. The stack type multichip package is configured in such a manner that plural semiconductor chips are superimposed and mounted on a substrate and electrode pads of these semiconductor chips are connected to an electrical connection portion provided on the substrate by using a bonding wire, respectively.

In the stack type multichip package, with the aim of connecting the semiconductor chip to a circuit board electrically beyond a scope connectable by the wire bonding, it has been known that an electrode pad for relaying is provided in advance to relay an electrode pad of one semiconductor chip to an electrode pad of the other semiconductor chip (for example, refer to Patent Document 1).

In addition, with the aim of improving productivity of the semiconductor chip laminated type package, it has been known that plural semiconductor chips having the same configurations and the same functions are laminated with slightly deviated so that the electrode pads of respective semiconductor chips are arranged with deviated (for example, refer to Patent Document 2).

Further, in order to laminate two semiconductor chips, of which outer sizes and arrangements of the bonding pads are different, it has been known that a wiring sheet with a wire formed on its front surface is clipped between two semiconductor chips (for example, refer to Patent Document 3).

In addition, upon laminating a plurality of semiconductor chips, it has been known that the electrode pad of the semiconductor chip to be arranged at the lower side is formed larger than the normal electrode pad and it is formed in a long rectangular shape along an edge of the semiconductor chip (for example, refer to Patent Document 4).

To this larger formed electrode pad, a bonding wire to be connected to the electrode pad of the semiconductor chip arranged at the upper side, and a bonding wire to be connected to the electrode pad formed on an insulative substrate arranged further lower of the lower arranged semiconductor chip are connected.

[Patent Document 1] JP-A-2001-196529
[Patent Document 2] JP-A-2001-298150
[Patent Document 3] JP-A-2001-7278
[Patent Document 4] JP-A-2002-110898

The electrode pads disclosed in the above-described patent document 1 and patent document 4 are elongated and arranged along the edge of the semiconductor chip, and this results in limitation of the number of the electrode pads to be formed on the semiconductor chip.

According to the configuration of the patent document 2, leads and a plurality of semiconductor chips are directly connected with each other by wires. Accordingly, each wire is made longer and it is feared that short circuit and breaking of the wires each other may occur due to wire sweep.

According to the configuration of the patent document 3, a wiring sheet must be prepared separately, so that a process to clip this wiring sheet is required.

In the conventional semiconductor chip laminated type package with the same functional and same structural semiconductor chips laminated, the electrode pad of the semiconductor chip located at the upper side is directly connected to the substrate by the bonding wire. Accordingly, it may be feared that the short circuit and the breaking of the bonding wires one another may occur due to so-called wire sweep and this leads to malfunction of the device.

In addition, in order to prevent the short circuit of the bonding wires one another, the lengths of the bonding wires are made different each other in a height direction of the package so as to avoid contact of the plural bonding wires one another three-dimensionally. However, such a configuration may increase the thickness of the package.

SUMMARY OF THE INVENTION

Accordingly, the present invention has been made taking the foregoing problems into consideration, and in order to solve the foregoing problems, a semiconductor chip according to the present invention has the following characteristics in its constitution.

In other words, the semiconductor chip may have a main surface composed of a rectangular shape. The main surface is provided with a first side and a second side opposed to the first side.

The semiconductor chip may comprise a main electrode pad group composed of a plurality of main electrode pads, which plurality of main electrode pads is arranged on the main surface along the first side; a first electrode pad group composed of a plurality of first electrode pads, which plurality of first electrode pads is arranged between the first side and the main electrode pad group; and a second electrode pad group composed of a plurality of second electrode pads, which plurality of second electrode pads is arranged on the main surface along the second side.

The semiconductor chip may comprise a first interconnection connecting the main electrode pad with the first electrode pad, and a second interconnection connecting the main electrode pad with the second electrode pad.

In addition, the present invention also relates to a semiconductor device with a plurality of semiconductor chips having such configurations laminated.

According to the configuration of the semiconductor chip of the present invention, it is possible to output a signal to be outputted from a main electrode pad provided in the vicinity of the first side to a first electrode pad provided along the first side and a second electrode pad provided along the second side.

Accordingly, since the electrode pads of the different semiconductor chips can be used for outputting the signal in the event of laminating a plurality of semiconductor chips of the present invention, the plural bonding wires are not superimposed one another three-dimensionally and this enables to prevent contact of the plural bonding wires one another. Accordingly, it is possible to prevent the malfunction of the semiconductor device in which the plural semiconductor chips are laminated.

In addition, as compared to the case of connecting the electrode pad of each semiconductor chip with the bonding pad of the substrate, the length of each bonding wire can be made shorter. As a result, it is possible to make the thickness of the semiconductor device, namely, the thickness of the package thinner.

With reference to the drawings, the embodiments of the present invention will be described below. In addition, the drawings merely illustrate the shape, the size and the arrangement relation of each component schematically to the extent of making the present invention understandable, and the present invention is not limited by these drawings. In addition, in the following explanation, a particular material, condition and numeric value condition or the like may be used, however, these are merely one of preferable examples and the present invention is not limited by these conditions.

Further, a manufacturing process of the semiconductor chips and the semiconductor device with the semiconductor chips laminated according to the present invention can be composed of the conventional and publicly-known manufacturing process by using a conventional and publicly-known material. Therefore, the detailed explanation thereof may be omitted.

The constituent elements of the semiconductor chip and the semiconductor device of each embodiment to be described later are given reference numerals composed of triple-digit figures and a hundred's digit figure corresponds to the number of each embodiment. Accordingly, if lower two figures of the reference numerals are identical each other, they represent the same constituent element. In this case, the duplicate detailed explanation may be omitted.

BRIEF DESCRIPTION OF THE DRAWINGS

FIGS. 4A, 4B, and 4C are schematic views explaining an example of arrangement relations of the semiconductor chip according to a second embodiment of the present invention;

DESCRIPTION OF THE PREFERRED EMBODIMENTS (First Embodiment)

A constituent example of a semiconductor chip 110 of the first embodiment according to the present invention will be described below with reference to FIG. 1.

Figure 1A:
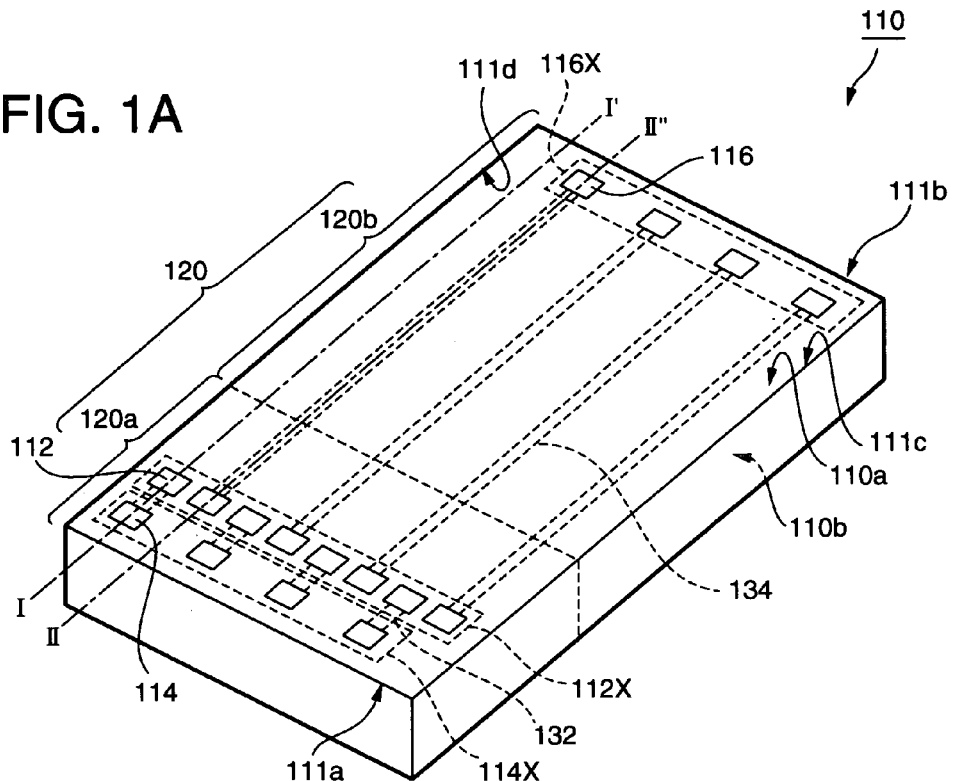
FIGS. 1A, 1B and 1C are schematic views explaining an example of arrangement relations of constituent elements of a semiconductor chip according to a first embodiment of the present invention.

FIG. 1A is a schematic perspective view for explaining an arrangement relation of constituent elements of the semiconductor chip 110.

Figure 1B:
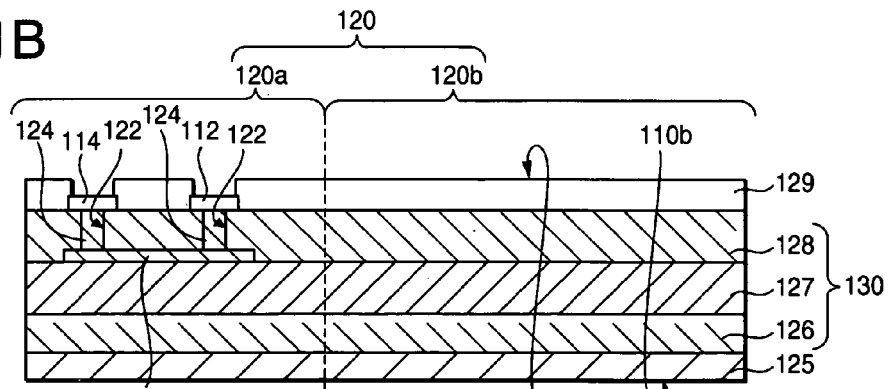
Figure 1C:
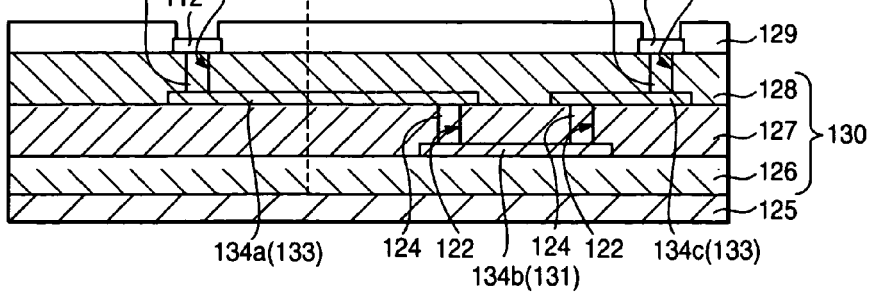

FIG. 1B is a pattern diagram for showing a cut surface taken on a dashed line represented by I–I' in FIG. 1A. In addition, FIG. 1C is a pattern diagram for showing a cut surface taken on a dashed line represented by II–II' in FIG. 1A.

1-1. Configuration of the Semiconductor Chip

The semiconductor chip 110 according to the first embodiment is entirely shaped in a rectangular solid, and may include a main surface 110*a* and a second main surface 110*b* opposed to this main surface 110*a*.

Opposite end edges at the side of the main surface 110*a* of the semiconductor chip 110 are defined as a first side 11*a* and a second side 111*b*, respectively, and opposite side edges thereof are defined as 111*c* and 111*d*, respectively.

On this main surface 110*a*, a plurality of main electrode pads 112 is disposed as a main electrode pad group 112X. The main electrode pad group 112X is disposed in the vicinity of the first end edge 11*a* and in parallel with the first end edge 111*a*. The respective electrode pads are arranged at certain intervals. In this example, eight electrode pads are arranged at even intervals.

In addition, on the main surface 110*a*, a first electrode pad group 114X is disposed. In the first electrode pad group 114X, a plurality of electrode pads 114 is arranged in a gap between the main electrode pad group 112X and the first side 111*a* along the first side 111*a*.

According to this example, the number of the first electrode pad 114 is less than the number of the main electrode pad 112, namely, the half number: four. These first electrode pads 114 are arranged at even intervals with opposed to every other electrode pads in the main electrode pads 112. Each electrode pad 114 passes through a center of the main electrode pad 112 and is centered on a line that is parallel to the side edge 111c. In this case, a second electrode pad group 116X is disposed at the side of the second side 111b of the main surface 110a.

In the second electrode pad group 116X, a plurality of second electrode pads 116 is arranged along the second side 111b. According to this example, the number of the second electrode pad 116 is less than the number of the main electrode pad 112, namely, the half number: four. These second electrode pads 116 are arranged at even intervals with opposed to the remaining four main electrode pads 112 that are not opposed to the first electrode pads 114. In this case, each electrode pad 116 passes through a center of the main electrode pad 112 and is centered on a line that is parallel to the side edge 111c.

In the following description, a direction that is parallel to the first and second sides of the semiconductor chip is referred to as a shorter direction or a width direction of the semiconductor chip. In addition, sometimes a direction that is vertical to the first and second sides thereof is referred to as a longer direction or a length direction.

Each number of the main electrode pad 112, the first electrode pad 114 and the second electrode pad 116 is not limited to the above-described number and the number and the interval corresponding to the specification of the semiconductor chip are available.

According to this example, these three kinds of electrode pads are shaped in a square of the same measurement, respectively. This size and shape of the electrode pad are not particularly limited if the wire can be bonded by an Au ball or the like.

In addition, a superficial area of these three kinds of electrode pads may be set so that, for example, the Au ball or the bonding wire can be bonded.

These three kinds of electrode pads can be formed by the conventional and publicly known manufacturing process by using a conventional and publicly known conductive material.

As shown in FIGS. 1A, 1B, and 1C, in the semiconductor chip 110 of this constituent example, an element formation range is located at its lowest layer 125. On the element formation range, the functional elements such as a transistor or the like are formed.

On the lowest layer 125, a wired structure 130 is provided, whereby signals are exchanged between the functional elements that are formed on the element formation range or the signals are outputted from the functional elements and are inputted in the functional elements.

This wired structure 130 is so-called multi-layer wired structure and it may include an embedded contact, an embedded via, a plurality of inter-layer insulative films, and a plurality of wired layers or the like.

On the lowest layer 125 including the element formation range, a wired layer of a multi-layer structure to be electrically connected to this element formation range is disposed as a part of the wired structure 130. According to this example, at the upper side of the lowest layer 125, a first wired layer 131 is disposed with a first inter-layer insulative film 126 intervening, and further, a second wired layer 133 is disposed with the first inter-layer insulative film 126 and a second inter-layer insulative film 127 intervening.

On this first inter-layer insulative film 126, a contact hole to electrically conduct the element formation range of the lowest layer 125 and an embedded contact into which this contact hole is embedded are provided (not illustrated).

In the semiconductor chip according to this example, the main electrode pad is directly connected to the functional element that is formed on the element formation range by this contact, the via, and the multi-layer wired structure or the like.

The second inter-layer insulative film 127 is formed on the first wired layer 131.

On the second inter-layer insulative film 127, a via hole 122 to conduct the first wired layer 131, and a embedded via 124 having this via hole 122 embedded therein and to be connected to the first wired layer 131 are formed.

On the second inter-layer insulative film 127, a second wired layer 133 to be electrically connected to the embedded via 124 is formed. On the second wired layer 133, a third inter-layer insulative film 128 is formed.

On the third inter-layer insulative film 128, a via hole 122 to conduct the second wired layer 133, and a embedded via 124 having this via hole 122 embedded therein and to be connected to the second wired layer 133 are formed.

The above-described main electrode pad 112, the first electrode pad 114, and the second electrode pad 116 are connected to the embedded via 124 that is formed on this third inter-layer insulative film 128. On the third inter-layer insulative film 128, on which these three kinds of electrode pads are formed, an insulative film 129 is formed with these three kinds of electrode pads partially exposed.

The main electrode pad 112 and the first electrode pad 114 adjoining this are connected each other by a first interconnection 132. This first interconnection 132 is provided as a part of the plural wires formed as the second wired layer 133 according to this example.

In addition, the main electrode pad 112 and the second electrode pad 116 are connected each other by a second interconnection 134.

It is preferable that the first interconnection 132 and the second interconnection 134 are made shorter as much as possible, namely, they are formed in a line pattern. However, sometimes an obstacle such as a via hole or the like may intervene between the pads to be connected.

In such a case, any one or the both of the first interconnection 132 and the second interconnection 134 are configured so as to bypass and avoid the obstacle two-dimensionally by a pattern that is appropriately flexed in the same-wired layer.

In addition, the upper or lower wired layer may avoid the obstacle three-dimensionally by the via hole and the embedded via having this via hole embedded therein.

Particularly, as shown in FIG. 1C, according to this example, the second interconnection 134 may include a first partial wire 134a as a part of the plural wires formed as the second wired layer 133, a second partial wire 134b as a part of the plural wires formed as the first wired layer 131, and a third partial wire 134c as a part of the plural wires formed as the second wired layer 133.

One end of the first partial wire 134a is connected to the main electrode pad 112 via the embedded via 124 that is disposed on the third inter-layer insulative film 128.

The other end of the first partial wire 134a is connected to one end of the second partial wire 134b via the embedded via 124 that is disposed on the second inter-layer insulative film 127.

The other end of the second partial wire 134b is connected to the second electrode pat 116 via the embedded via 124 that is disposed on the second inter-layer insulative film 127.

Thus, the embedded via serves as an electric resistance when the electrode pads are connected each other three-dimensionally bypassing the obstacle by using the embedded via in the via hole, so that it is preferable that the wire to be formed in the same wired layer are made longer as much as possible. Specifically, for example, the first partial wire 134a may be made longer as much as possible within the second wired layer 133. This leads to decrease the wire resistance more.

In this example, it is described that the interconnection is provided in the semiconductor chip as the multi-layer wired structure, however, the interconnection may be provided on the main surface. In addition, the interconnection may be provided on the same layer as the electrode pad.

The wired structure 130 can be formed by a conventional, publicly known and arbitrary material and an arbitrary and preferable process.

Thus, the first and second interconnections 132 and 134 are formed in the process of forming the wired layer from among the processes of forming the wired structure 130.

The semiconductor chips according to the present constituent example are the semiconductor chips to be laminated and these plural semiconductor chips to be laminated have the same functions and the same figurations with each other.

Accordingly, in the semiconductor chip according to the present constituent example, a first range (an exposed range) that is exposed from the other semiconductor chip when the other semiconductor chip is laminated and a second range (a laminated range) that the other semiconductor chip may contact are provided.

The ratio shared by these exposed range and laminated range on the main surface of the semiconductor chip may be set as the arbitrary and preferable ratio in consideration of the specification and the layer condition of the semiconductor chip.

For example, taking the constituent example shown in FIG. 1 as an example, an exposed range 120a as a range including the main electrode pad group 112X and the first electrode pad group 114X and a laminated range 120b as a range including the second electrode pad group adjoining the exposed range 120a are provided. As described above, these exposed range 120a and laminated range 120b may correspond to the range where the circuit element, the multi-layer wired structure and the electrode pad are formed, namely, so-called active range (120).

For example, this semiconductor chip is assumed to be used as a chip to compose the multichip package as laminated.

Accordingly, if the semiconductor chip is, for example, a memory chip, the circuit element formation range is provided with a memory cell array, a peripheral circuit such as a control circuit or the like that is connected to the memory cell array so as to enclose this memory cell array, an analog circuit including an amplifier circuit or the like, and a redundancy circuit including a fuse array. Among these, particularly, the analog circuits having fear to occur malfunction due to the stress generated when the other semiconductor chip is laminated thereon are preferably formed as accumulated in the range in the vicinity of the lower side of one or the both of the main electrode pad group 112X and the first electrode pad group 114X, namely, within the corresponding element formation range within the exposed range 120a of the semiconductor chip 110.

According to such semiconductor chip of the first embodiment, a certain main electrode pad 112 is connected to the first electrode pad 114 that is disposed at the first side 111a through the first electrode interconnection 132, and the other main electrode pad 112 is connected to the second electrode pad 116 that is disposed at the second side 11b through the second electrode interconnection 134. Therefore, the signals to be outputted from the main electrode pad 112 can be outputted to any one of the first electrode pad 114 or the second electrode pad 116. In other words, the signals can be outputted as allocated in the different directions.

1-2. Semiconductor Device

The semiconductor device according to the present invention is characterized in that a plurality of semiconductor devices having the same configurations is laminate. With reference to FIG. 2, the constituent example of the semiconductor device having the layer structure in which the semiconductor chips 110 according to the first embodiment are laminated will be described below. Since a plurality of semiconductor chips to be mounted on the substrate are identically configured, they are given hyphen and numerical characters conveniently so as to distinguish each semiconductor chip (and so forth in the following embodiments).

Figure 2A:
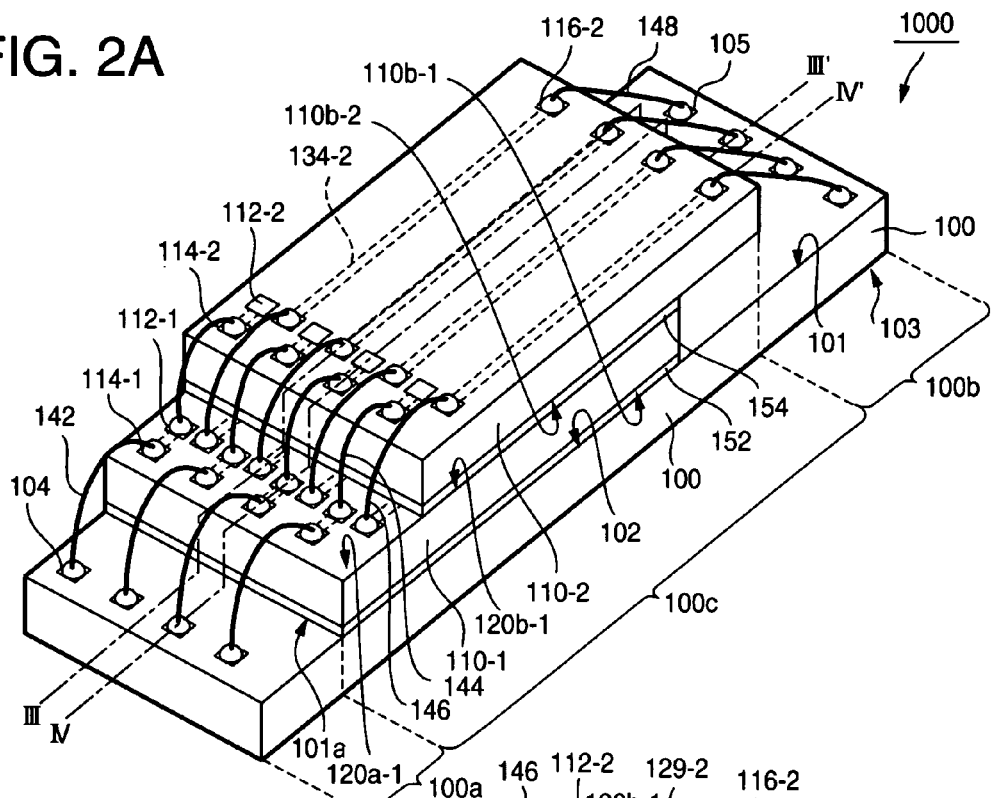
FIGS. 2A, 2B, and 2C show examples of lamination of the semiconductor chips according to the first embodiment of the present invention.

FIG. 2A is a schematic perspective for explaining a semiconductor device 1000 having a layer structure in which two semiconductor ships 110 are laminated.

Figure 2B:
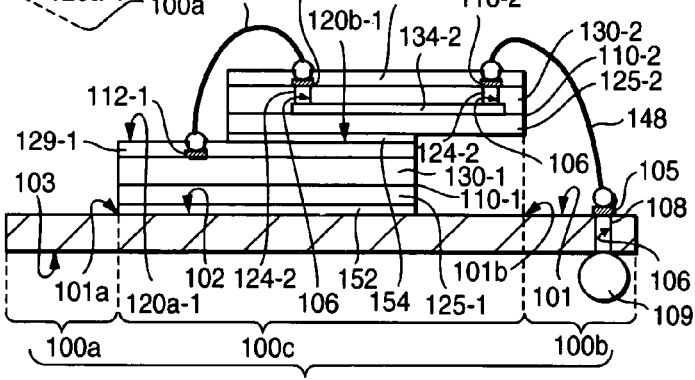
Figure 2C:
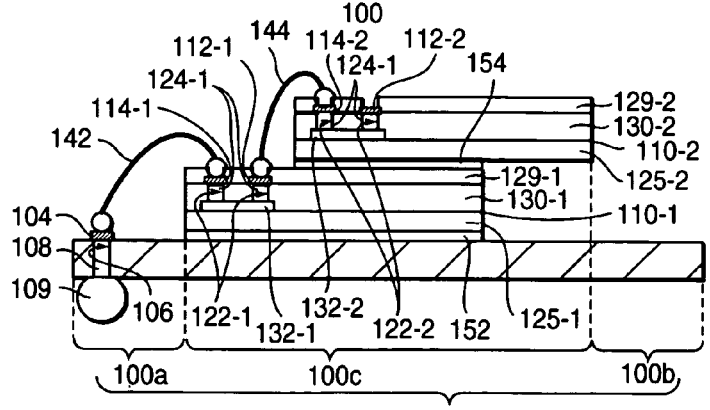

FIG. 2B is a pattern diagram for showing a cut surface taken on a dashed line represented by III–III' in FIG. 2A. In addition, FIG. 2C is a pattern diagram for showing a cut surface taken on a dashed line represented by IV–IV' in FIG. 2A.

The semiconductor-device 1000 may include a substrate 100 at its lowest layer. The substrate 100 is shaped in a rectangular solid, and a second front surface 101 and a second front surface 103 opposed to this first front surface 101 are shaped in a rectangle.

The substrate 100 has a first range 100a, a second range 10b, and a third range 100c that adjoins these first and second ranges 100a and 100b as sandwiched therebetween, and on the first main surface 101, a rectangular semiconductor chip mounted range 102 is provided on the range corresponding to the third range 100c. The semiconductor chip mounted range 102 is defined by a first side 101a, a second side 101b opposed to this first side 101a, and two sides to connect these.

Specifically, the semiconductor chip mounted range 102, namely, the third range 100c may be shaped and sized so that its outline may include a compositive outline when viewing all semiconductor ships that are laminated in this range from the upper surface.

In addition, the lengths of the first side 101a and the second side 101b, namely, the width of the substrate 100 is adapted to the width of the semiconductor chip to be mounted. In this way, it is possible to make the entirety of the package more compact. However, the shape and the outer size of the substrate 100 can be selected preferably and arbitrarily.

On the first front surface 101 corresponding to the first range 100a of the substrate 100, a plurality of first bonding pads 104 is arranged at even intervals in parallel with the first side 101a on the front surface range at one end edge of the substrate 100 at the outside of the first side 101a at the outside of the semiconductor-chip mounted range 102.

As shown in FIG. 2C, just under the first bonding pad 104, a via hole 106 and a via 108 having this via hole 106 embedded therein are disposed. An external terminal 109 is connected to this embedded via 108.

Further, on the first front surface 101 corresponding to the second range 100b of the substrate 100, a plurality of second bonding pads 105 is arranged at even intervals in parallel with the second side 101*b* at the outside of the semiconductor chip mounted range 102 corresponding to the third range 100*c*.

As same as the above, as shown in FIG. 2B, just under the second bonding pad 105, the via hole 106 and the via 108 having this via hole 106 embedded therein are disposed. The external terminal 109 is connected to this embedded via 108.

According to the present example, the external terminal 109 is defined as a metal ball made of Au or the like. The shape of the external terminal 109 is not limited to this and for example, it can be also shaped in so-called land. The semiconductor device 1000 is mounted on a mounted substrate by using this external terminal 109.

The above-described constituent elements of the substrate 100 can be formed by selecting the conventional and publicly known materials arbitrarily and preferably.

A first semiconductor chip 110-1 is mounted on the semiconductor chip mounted range 102 of the substrate 100 by a first dice bond material 152 with a second main surface 110*b*-1 bonded thereto.

A second semiconductor chip 110-2 is mounted on a laminated area 120*b*-1 of the first semiconductor chip 110-1 by a second dice bond material 154 with a second main surface 110*b*-2 bonded thereto.

In this case, an exposed range 120*a*-1 of the first semiconductor chip 110-1 is exposed from a second semiconductor chip 110-2.

In other words, the second semiconductor chip 110-2 is mounted on the first semiconductor chip 110-1 in such a manner that it is deviated in the length direction of the first semiconductor chip 110-1 so as to expose the exposed range 120*a*-1 and it is located in the width direction of the first semiconductor chip 110-1 so as to correspond to the outline of the first semiconductor chip 110-1.

In this case, the first and second semiconductor chips are made alignment so that a line connecting a first electrode pad 114-2 of the second semiconductor chip 110-2 with a main electrode pad 112-1, to which this main electrode pad 112-1 is connected, of the first semiconductor chip 110-1 may cross the first sides of the first and second semiconductor chips at right angles.

These first and second dice bond materials 152 and 154 can be selected arbitrarily and preferably from among the conventional and publicly known dice bond materials for forming a layer structure.

The first dice bond material 152 to adhere the substrate 100 and the first semiconductor chip may be insulative or conductive one. In addition, the second dice bond material 154 to adhere the two semiconductor chips each other is insulative one and it is preferable that the second dice bond material 154 may be selected from among the arbitrary and preferable dice bond materials having a low stress property without damaging the semiconductor chip at the lower side.

An object of the semiconductor device according to the present constituent example is to decrease the number of the terminals to externally output the signal and the same electrode pads corresponding to the first and second semiconductor chips are connected each other by the bonding wire.

Each of first bonding wires 142 may connect each of the first bonding pads 104 of the substrate 100 with each of first electrode pads 114-1 of the first semiconductor chip 110-1. The lengths of the first bonding wires 142 are the same so as to connect each of the first bonding pads 104 with each electrode pad one-on-one.

Each of second bonding wires 144 may connect each of the main electrode pad 112-1, which is connected to the first electrode pads 114-1 of the first semiconductor chip 110-1, of the first semiconductor chip 110-1 with each of the first electrode pads 114-2 of the second semiconductor chip 110-2 one-on-one. The second bonding wire 144 may include a plurality of wires of the same lengths.

Each of third bonding wires 146 connects each of the main electrode pads 112-1, which is not connected to the first electrode pads 114-1, of the first semiconductor chip 110-1 with each of main electrode pads 112-2, which is not connected to the first electrode pads 114-2, of the second semiconductor chip 110-2 one-on-one. Each bonding wire has the same length.

Each of fourth bonding wires 148 connects each of second electrode pads 116-2 of the second semiconductor chip 110-2 with each of the second bonding pads 105 of the substrate 100 one-on-one. Each bonding wire has the same length.

Further, since the semiconductor device can output the same signal to the first main electrode pads 112 and to the first electrode pads 114, or these electrode pads can output the signals, particularly, any of the above-described bonding wires to be bonded to the main electrode pads 112-2 of the second semiconductor chip 110-2 can be also bonded to the first electrode pads 114.

The process to connect the above-described each bonding wire with each bonding pad or with each electrode pad, namely, the bonding process may be preferably effected by ball bonding using an Au ball.

The bonding process can be effected by using the conventional and publicly known bonding device in accordance with the selected arbitrary and preferable wire materials or the like. This bonding process may be effected by a arbitrary and preferable method such as a thermo compression bonding and an ultrasonic compressing bonding or the like.

In the next place, with reference to FIG. 3, the package example of the semiconductor device according to the first embodiment that has been explained with reference to FIG. 2.

Figure 3:
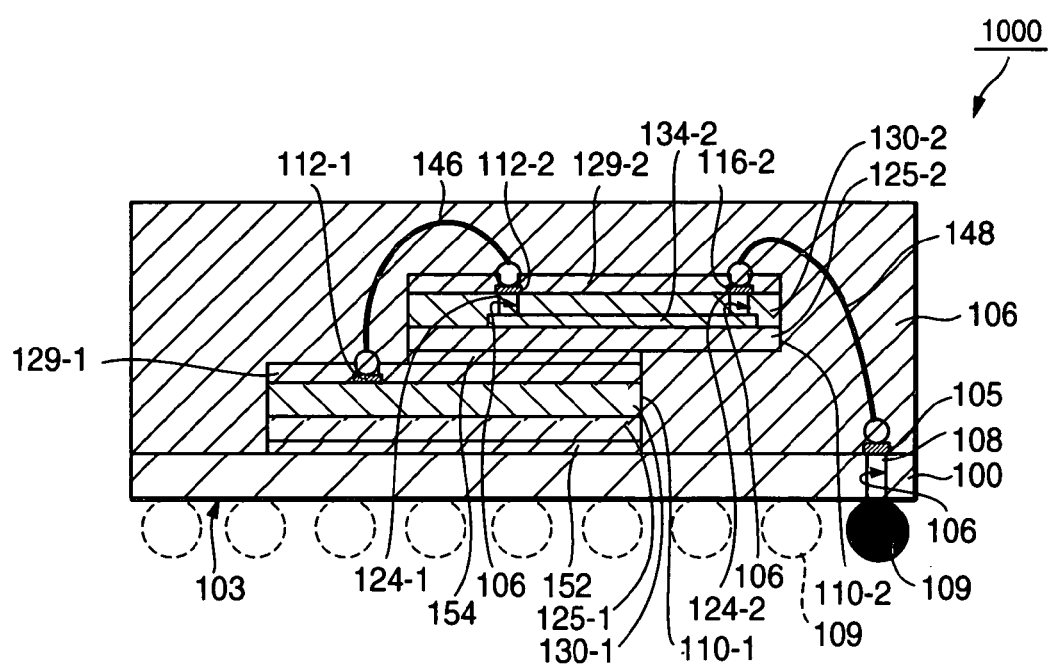
FIG. 3 shows an example of packaging of the semiconductor chips according to the first embodiment of the present invention.

FIG. 3 illustrates a constituent example formed in a package having the semiconductor device 1000 that has been explained with reference to FIG. 2 sealed by sealing resin. Further, FIG. 3 is a pattern diagram for showing a cut surface to cut the semiconductor device 1000 at the same position as FIG. 2B.

The first and second semiconductor chips 110-1 and 110-2; and first, second, third and fourth bonding wires 142, 144, 146 and 148 may be sealed by a sealing portion 160. This sealing portion 160 can be formed by the conventional and publicly known process by using the arbitrary and preferable material such as the conventional and publicly known mold resin and a liquid resin or the like.

As described above, just under the first and second bonding pads 105 of the substrate 100, the embedded via 108 to fill in the inside of the via hole 106 is provided. The external terminal 109 projecting from the second surface 103 is connected to this embedded via 108. On this cut surface, only one external terminal 109 is shown, however, a plurality of external terminals 109 may be formed at the side of the second surface 103 shown by a broken line in practice, for example, in a ball-like shape. Accordingly, the external terminal 109 shown in FIG. 3 is co-called BGA (Ball Grid Array). In addition, in place of the BGA, a plurality of external terminals 109 is formed as a land to be formed in a LGA (Land Grid Array) that is arrayed in a grid-like shape.

A signal to be outputted from the semiconductor chip mounted on this substrate 100 can be outputted to one or two or more external terminals 109 other than the illustrated external terminal 109, for example, via the wired structure within the substrate 100 (not illustrated).

According to the constituent example of the semiconductor device that has been described with reference to FIG. 2 and FIG. 3, any of the bonding wires can be made shorter. In other words, the electric short-circuit due to contact of the bonding wires each other can be effectively prevented. Accordingly, it is possible to provide a semiconductor device having a high reliability.

1-3. Operation

Here, with reference to FIG. 2 again, the operation of the semiconductor device will be described.

The semiconductor device 1000 according to the first embodiment can output the signals to the external device through four paths. In this case, an example that a signal to be generated by the semiconductor chip 100 is outputted to the external terminal 109 that is disposed on the substrate 100 will be described below.

With respect to the case that the signals are inputted in the semiconductor chip 110, the paths to be described below are made reversed, so that its explanation will be herein omitted. In addition, in order to make the explanation simple, the signals to be outputted by the semiconductor chip are sequentially named as A, B, C, D, . . . for each path (the same applies to the following embodiments).

1) First Path

A signal A generated in a circuit element range 125-1 of the first semiconductor chip 110-1 is outputted to the main electrode pad 112-1 via a wired structure 130-1.

Consequently, the signal A outputted to the main electrode pad 112-1 will be outputted to the first electrode pad 114-1 via a first interconnection 132-1 that is connected to the main electrode pad 112-1.

The signal A that is outputted to the first electrode pad 114-1 will be outputted to the first boning pad 104 of the substrate 100 via the first bonding wire 142.

The signal A outputted to the first boning pad 104 will be outputted to the external terminal 109 via the embedded via 108.

2) Second Path

A signal B generated in a circuit element range 125-2 of the second semiconductor chip 110-2 is outputted to the main electrode pad 112-2 via a wired structure 130-2.

Consequently, the signal B outputted to the main electrode pad 112-2 will be outputted to the first electrode pad 114-2 via a first interconnection 132-2 that is connected to the main electrode pad 112-2.

The signal B that is outputted to the first electrode pad 114-2 will be outputted to the main electrode pad 112-1 of the first semiconductor chip 110-1.

Consequently, the signal B outputted to the main electrode pad 112-1 will be outputted to the first electrode pad 114-1 via a first interconnection 132-1 that is connected to the main electrode pad 112-1.

The signal B that is outputted to the first electrode pad 114-1 will be outputted to the first boning pad 104 of the substrate 100 via the first bonding wire 142.

The signal B outputted to the first boning pad 104 will be outputted to the external terminal 109 via the embedded via 108.

3) Third Path

A signal C generated in a circuit element range 125-2 of the second semiconductor chip 110-2 is outputted to the main electrode pad 112-2 via a wired structure 130-2.

Consequently, the signal C outputted to the main electrode pad 112-2 will be outputted to the second electrode pad 116-2 via a second interconnection 134-2 that is connected to the main electrode pad 112-2.

The signal C that is outputted to the second electrode pad 116-2 will be outputted to the second boning pad 105 of the substrate 100 via the fourth bonding wire 148.

The signal C outputted to the second boning pad 105 will be outputted to the external terminal 109 via the embedded via 108.

4) Fourth Path

A signal D generated in a circuit element range 125-1 of the first semiconductor chip 110-1 is outputted to the main electrode pad 112-1 via the wired structure 130-1.

The signal D that is outputted to the main electrode pad 112-1 will be outputted to the main electrode pad 112-2 of the second semiconductor chip 110-2 via the third bonding wire 146 that is connected to the main electrode pad 112-1.

Consequently, the signal D outputted to the main electrode pad 112-2 will be outputted to the second electrode pad 116-2 via the second interconnection 134-2 that is connected to the main electrode pad 112-2.

The signal D that is outputted to the second electrode pad 116-2 will be outputted to the second boning pad 105 of the substrate 100 via the fourth bonding wire 148.

The signal D outputted to the second boning pad 105 will be outputted to the external terminal 109 via the embedded via 108.

According to the configuration of the semiconductor device of the present embodiment, the signals outputted from the main electrode pads of the first and second semiconductor chips can be outputted as allocated in any of the first bonding pad of the substrate located at the first side or the second bonding pad of the substrate located at the first side. In addition, the signals to be inputted from the both of the first and second boding pads can be inputted in the main electrode pads of the first and second semiconductor chips.

According to the configuration of the semiconductor device of the present embodiment, the length of the bonding wire can be shorter and the height thereof can be lower. Accordingly, the short-circuit due to contact of the bonding wires each other can be effectively prevented. Further, the thickness of the package can be made thinner.

(Second Embodiment)

A constituent example of a semiconductor chip 210 according to the second embodiment of the present invention will be described with reference to FIG. 4.

FIG. 4A is a schematic perspective view for explaining the arrangement relation of the constituent element of the semiconductor chip 210.

FIG. 4B is a pattern diagram for showing a cut surface taken on a dashed line represented by I–I' in FIG. 4A. In addition, FIG. 4C is a pattern diagram for showing a cut surface taken on a dashed line represented by II–II' in FIG. 4A.

2-1. A Structure of a Semiconductor Chip

The semiconductor chip 210 according to the second embodiment is characterized only in a connection relation between the first main electrode pad 212 and the first electrode pad 214, and the other constituent elements are identical with those of the semiconductor chip 110 according to the first embodiment. Accordingly, this connection relation will be mainly described below, and the reference numerals having the same lower two digits are given to the same structures as the first embodiment and their detailed explanations are herein omitted.

A main electrode pad 212 composing a main electrode pad group 212X is connected to a first electrode pad group 214X via a conversion circuit portion 236.

Figure 5A:
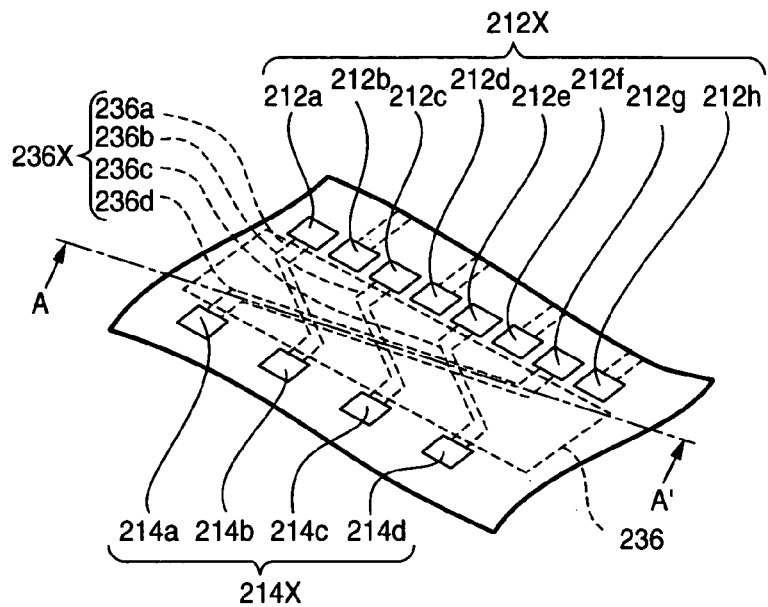
FIGS. 5A and 5B are schematic sectional views explaining a conversion circuit of the semiconductor chip according to a second embodiment of the present invention.
Figure 5B:
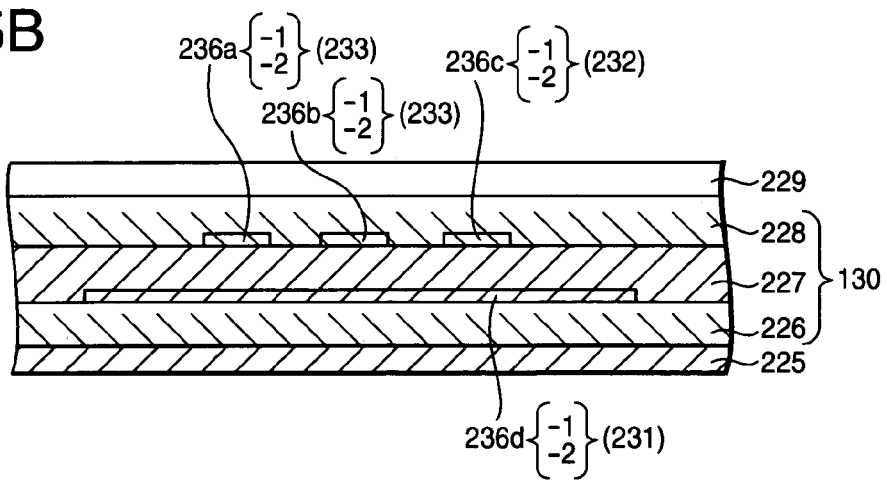

Here, the configuration of the conversion circuit portion 236 will be described with reference to FIG. 5. FIG. 5 is a partial enlarged view particularly showing an enlarged partial area in the vicinity of the main electrode pad group 212X, the conversion circuit portion 236, and the first electrode pad group 214X. FIG. 5B is a pattern diagram for showing a cut surface taken on a dashed line represented by A–A' in FIG. 5A.

As shown in FIG. 5A, the main electrode pad 212 is connected to the first electrode pad group 214X via the conversion-circuit portion 236. According to the present example, the conversion circuit portion 236 may include a conversion wire array having a first conversion wire 236a, a second conversion wire 236b, a third conversion wire 236c, and a fourth conversion wire 236d.

According to this constituent example, the main electrode pad 212 may include a first main electrode pad 212a, a second main electrode pad 212b, a third main electrode pad 212c, a fourth main electrode pad 212d, a fifth main electrode pad 212e, a sixth main electrode pad 212f, a seventh main electrode pad 212g, and an eighth main electrode pad 212h.

The first electrode pad 214 may include a first electrode pad 214a, a second electrode pad 214b, a third electrode pad 214c, and a fourth electrode pad 214d.

According to the present example, the first main electrode pad 212a is connected to one end of the first conversion wire 236a, which is flexed in an approximate S-shape. The other end of the first conversion wire 236a is connected to the second electrode pad 214b.

The third main electrode pad 212c is connected to one end of the second conversion wire 236b, which is flexed in an approximate S-shape. The other end of the second conversion wire 236b is connected to the third electrode pad 214c.

The fifth main electrode pad 212e is connected to one end of the second conversion wire 236c, which is flexed in an approximate S-shape. The other end of the third conversion wire 236c is connected to the fourth electrode pad 214d.

The seventh main electrode pad 212g is connected to one end of the fourth conversion wire 236d, which is flexed in an approximate S-shape. The other end of the fourth conversion wire 236d is connected to the first electrode pad 214a under the first conversion wire 236a, the second conversion wire 236b, and the third conversion wire 236c.

In other words, as shown in FIG. 5B, the first electrode pad 214a under the first conversion wire 236a, the second conversion wire 236b, and the third conversion wire 236c may be formed as a part of a second wired layer 233. The fourth conversion wire 236d may be formed as a part of a first wired layer 231 that is lower than the second wired layer 233.

The opposite ends of these conversion wires are electrically connected to the main electrode pad 212 and the first electrode pad 214, respectively, through the via hole and the embedded via (not illustrated).

According to the configuration of the semiconductor chip of the second embodiment, it is possible to obtain the same effect as that of the first embodiment. In addition, it is possible to output the signals to be outputted from the main electrode pad 212 to the first electrode pad 214 that is arbitrarily selected. Accordingly, the position of the first electrode pad can be optimized in accordance with the position of the bonding pad of the existing substrate so as to output the arbitral signals.

2-2. Semiconductor Device

A constituent example of the semiconductor device having the layer structure with the semiconductor chips 210 of the second embodiment according to the present invention laminated will be described below with reference to FIG. 6 and FIG. 7.

Figure 6A:
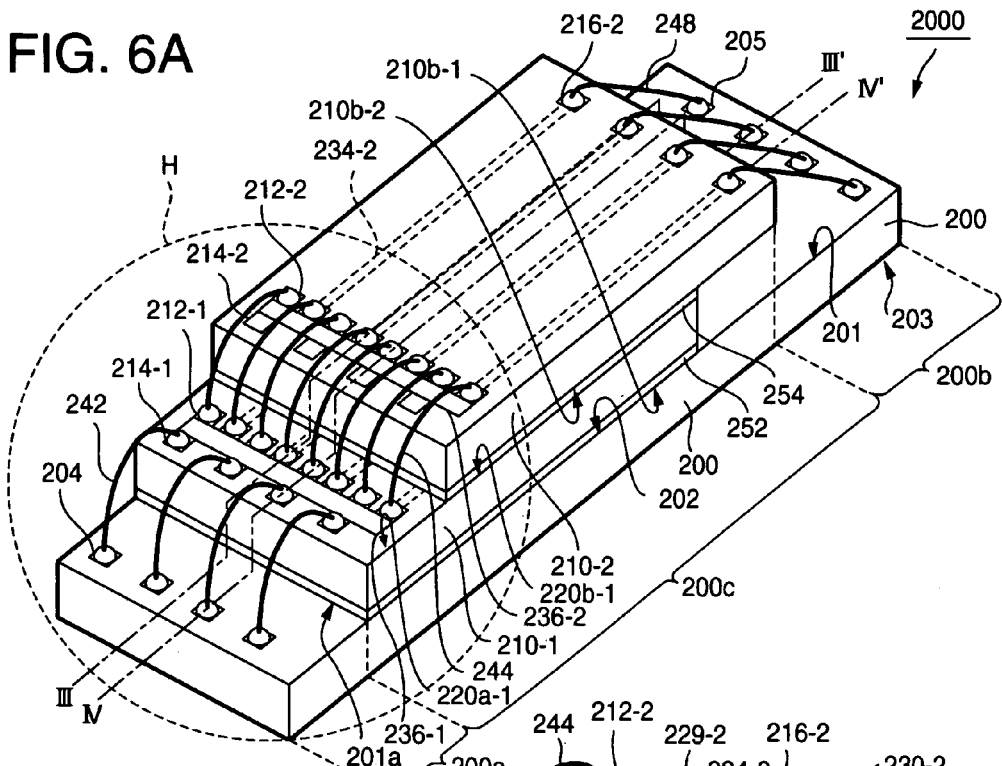
FIGS. 6A, 6B, and 6C show examples of lamination of the semiconductor chip according to the second embodiment of the present invention.

FIG. 6A is a schematic perspective view for explaining a semiconductor device 2000 having the layer structure with two semiconductor chips 210 laminated.

Figure 6B:
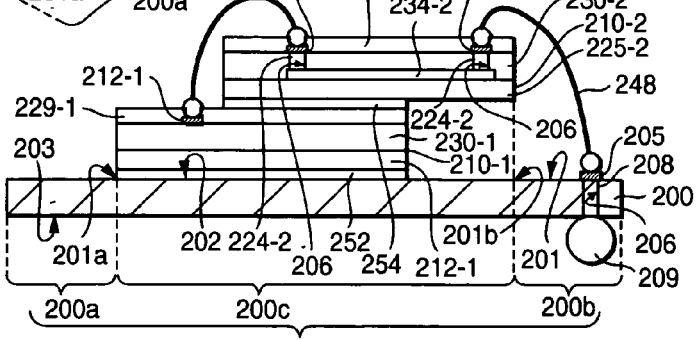
Figure 6C:
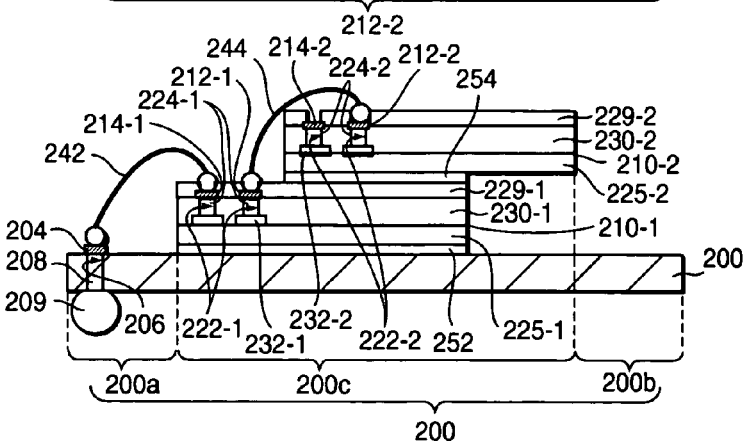

FIG. 6B is a pattern diagram for showing a cut surface taken on a dashed line represented by III–III' in FIG. 6A. In addition, FIG. 6C is a pattern diagram for showing a cut surface taken on a dashed line represented by IV–IV' in FIG. 6A.

Figure 7:
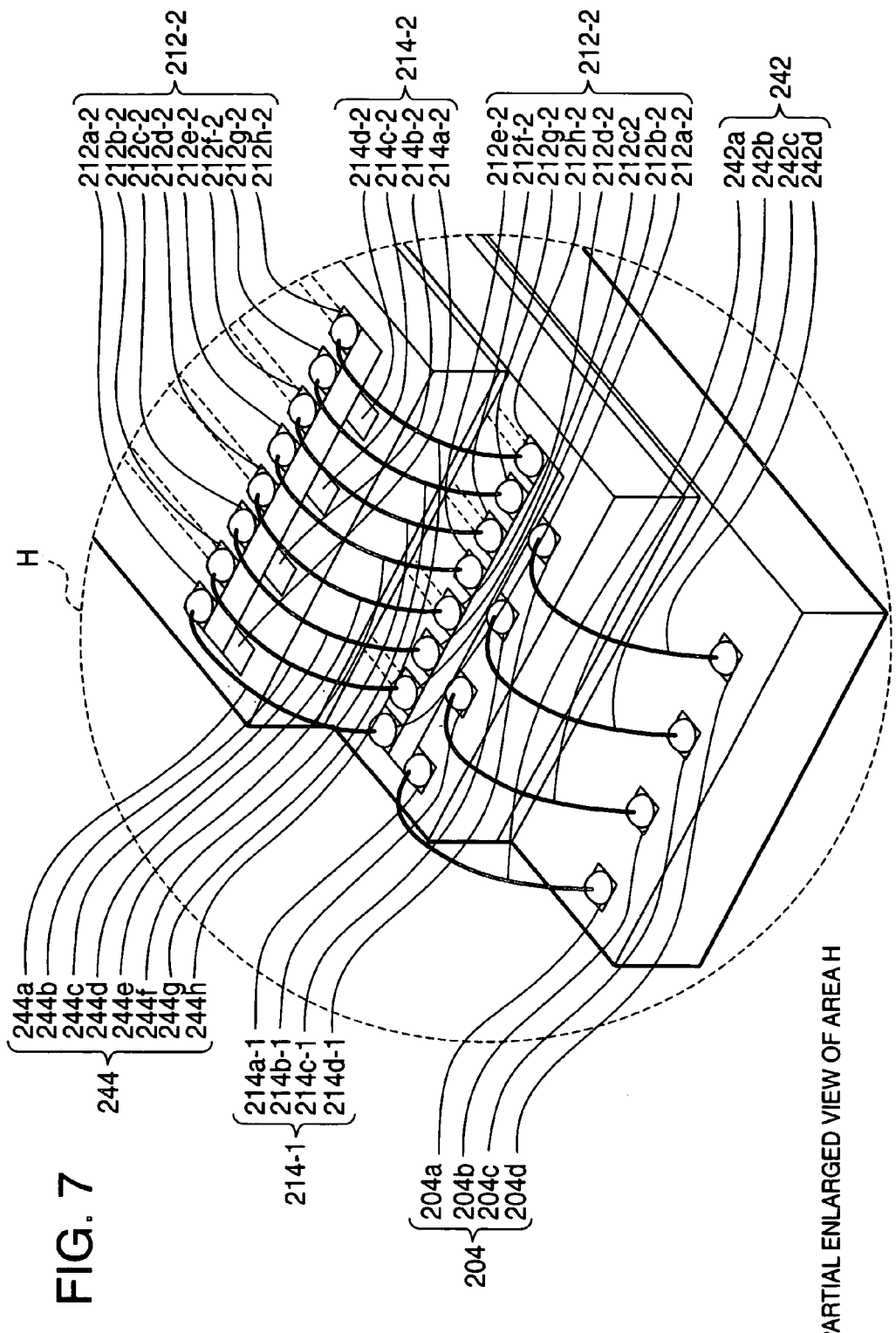
FIG. 7 is a partial enlarged view showing an enlarged area H in FIG. 6.

FIG. 7 is an enlarged view showing an enlarged partial area of the semiconductor device 2000 shown in FIG. 6A that is circled by a broken line H.

Since the layer structure of the semiconductor device of the present embodiment is identical with that of the semiconductor device of the first embodiment, its detailed explanation is herein omitted.

Here, the connection relation between each bonding wire and each electrode pad or each bonding pad will be described.

A first bonding wire 242 serves to connect a first electrode 214-1 of the first semiconductor chip with a first bonding pad 204 of the substrate 100 one-on-one. These first bonding wires 242 have the same lengths.

A first wire 242a may connect a first bonding pad 204a of the substrate 200 with a first electrode pad 214a-1.

A second wire 242b may connect a first bonding pad 204b of the substrate 200 with a second electrode pad 214b-1.

A third wire 242c may connect a first bonding pad 204c of the substrate 200 with a third electrode pad 214c-1.

A fourth wire 242d may connect a first bonding pad 204d of the substrate 200 with a fourth electrode pad 214d-1.

These first 242a to fourth 242d wires are connected to each of the first bonding pads 204 in the shortest distance so as to prevent the short circuit due to contact each other.

A second bonding wire 244 serves to connect a main electrode pad 212-1 of the first semiconductor chip with a main electrode pad 212-2 of the second semiconductor chip 210 one-on-one. These second bonding wires 244 have the same lengths.

According to the present constituent example, as shown in FIG. 7, as the second bonding wire 244, a first wire 244a, a second wire 244b, a third wire 244c, a fourth wire 244d, a fifth wire 244e, a sixth wire 244f, a seventh wire 244g, and an eighth wire 244h are provided.

The first wire 244a may connect a first main electrode pad 212a-1 of a first semiconductor chip 210-1 with a first main electrode pad 212a-2 of a second semiconductor chip 210-2.

The second wire 244b may connect a second main electrode pad 212b-1 of the first semiconductor chip 210-1 with a second main electrode pad 212b-2 of the second semiconductor chip 210-2.

The third wire 244c may connect a third main electrode pad 212c-1 of the first semiconductor chip 210-1 with a third main electrode pad 212c-2 of the second semiconductor chip 210-2.

The fourth wire 244d may connect a fourth main electrode pad 212d-1 of the first semiconductor chip 210-1 with a fourth main electrode pad 212d-2 of the second semiconductor chip 210-2.

The fifth wire 244e may connect a fifth main electrode pad 212e-1 of the first semiconductor chip 210-1 with a fifth main electrode pad 212e-2 of the second semiconductor chip 210-2.

The sixth wire 244f may connect a sixth main electrode pad 212f-1 of the first semiconductor chip 210-1 with a sixth main electrode pad 212f-2 of the second semiconductor chip 210-2.

The seventh wire 244g may connect a seventh main electrode pad 212g-1 of the first semiconductor chip 210-1 with a seventh main electrode pad 212g-2 of the second semiconductor chip 210-2.

The eighth wire 244h may connect an eighth main electrode pad 212h-1 of the first semiconductor chip 210-1 with an eighth main electrode pad 212h-2 of the second semiconductor chip 210-2.

According to the semiconductor device 2000 of the present example, it is described that all of the second bonding wire 244 at the side of the second semiconductor chip 200-2 are connected to the main electrode pads 212-2, however, the first wire 244a, the third wire 244c, the fifth wire 244e, and the seventh wire 244g may be connected to the first electrode pad 214-2.

Third bonding wires 248 have the same lengths, respectively, as same as the above-described first and second bonding wires.

The third bonding wire 248 may connect a second electrode pad 216-2 of the second semiconductor chip 210-2 with the second bonding pad 205 of the substrate 200 one-on-one (refer to FIG. 6A).

Figure 8:
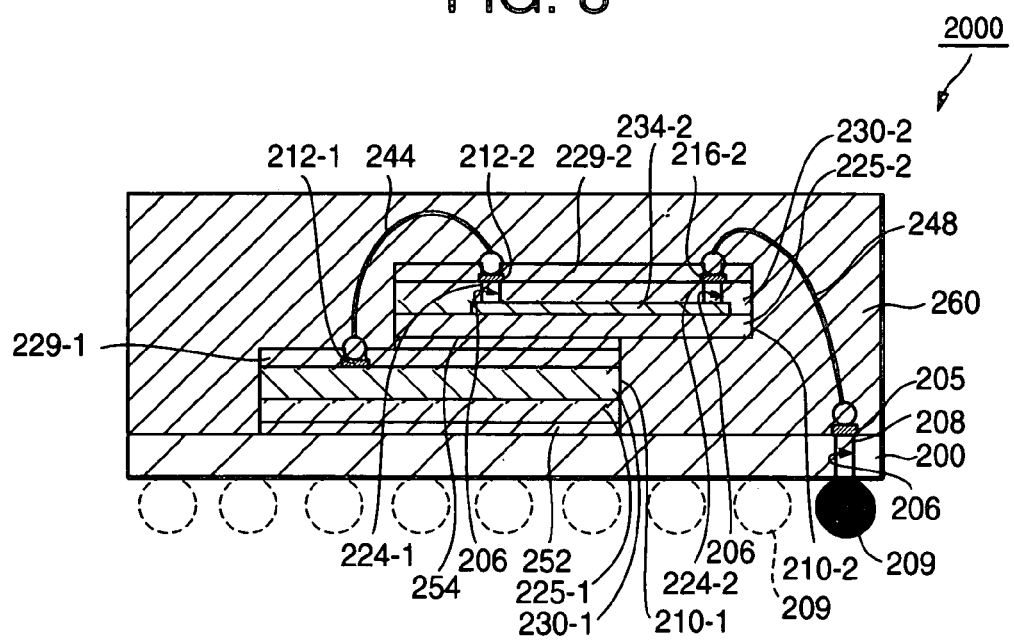
FIG. 8 shows an example of packaging of the semiconductor chips according to the second embodiment of the present invention.

FIG. 8 shows a constituent example that the semiconductor device 2000 that has been described with reference to FIG. 6 and FIG. 7 is sealed by sealing resin to obtain a package formation. Further, FIG. 8 is a pattern diagram showing a cut surface obtained by cutting the substrate 200 at the same position of FIG. 6B.

Since the constituent elements and the manufacturing processes of the package example of the semiconductor device according to the second embodiment shown in FIG. 8 are substantially identical with those of the first embodiment that has been described, their detailed explanation will be omitted here.

According to the configuration of the semiconductor device of the second embodiment, it is possible to obtain the same effect as that of the configuration that has been explained in the first embodiment. In addition, it is possible to output the signals to be outputted from the main electrode pads to the first electrode pad that is arbitrarily selected. Accordingly, the position of the first electrode pad can be optimized in accordance with the position of the bonding pad of the existing substrate so as to output the arbitral signals.

2-3. Operation

Here, with reference to FIG. 5, FIG. 6 and FIG. 7 again, the operation of the semiconductor device 2000 will be described.

The semiconductor device 2000 according to the second embodiment can output the signals to the external device through four paths. In this case, an example that the signals to be generated by the first and second semiconductor chips 210-1 and 210-2 are outputted to an external terminal 209 that is disposed on a substrate 200 through four paths will be described below. With respect to the case that the signals are inputted in the semiconductor chip 210, as same as the first embodiment, its explanation is herein omitted. The operation of the conversion circuit 236 will be described with reference to FIG. 5. In this case, the conversion circuit 236 of the first semiconductor chip is given a reference numeral 236-1 and the conversion circuit 236 of the second semiconductor chip is given a reference numeral 236-2.

1) First Path

A signal A generated in a circuit element range 225-1 of the first semiconductor chip 210-1 is outputted to a first main electrode pad 212a-1 via a wired structure 230-1.

Consequently, the signal A outputted to the first main electrode pad 212a-1, as shown in FIG. 5, will be outputted to the second electrode pad 214b-1 of the first electrode pad via a first conversion wire 236a-1 that is connected to the first main electrode pad 212a-1.

The signal A that is outputted to the second electrode pad 214b-1 will be outputted to a second sub bonding pad 204b of the first bonding pad 204 via the second wire 242b of the first bonding wire 242.

The signal A outputted to the second sub bonding pad 204b will be outputted to the external terminal 209 via an embedded via 208.

In the same way, the signal A outputted to the third main electrode pad 212c-1 of the first semiconductor chip 210-1 will be outputted to the external terminal 209 via a second conversion wire 236b-1, the third electrode pad 214c-1, the third wire 242c of the first bonding wire 242, and a third sub bonding pad 204c of the first bonding pad 204, sequentially, and via the embedded via 208.

The signal A to be outputted from the fifth main electrode pad 212e-1 of the first semiconductor chip 210-1 will be outputted to the external terminal 209 via a third conversion wire 236c-1, the fourth electrode pad 214d-1, the fourth wire 242d of the first bonding wire 242, and a fourth sub bonding pad 204d of the first bonding pad 204, sequentially, and via the embedded via 208.

The signal A to be outputted from the seventh main electrode pad 212g-1 of the first semiconductor chip 210-1 will be outputted to the external terminal 209 via a fourth conversion wire 236d-1, the first electrode pad 214a-1, the first wire 242a of the first bonding wire 242, and a first sub bonding pad 204a of the first bonding pad 204, sequentially, and via the embedded via 208.

2) Second Path

A circuit element range 225-2 of the second semiconductor chip 210-2 generates a signal B, and then, the signal B is outputted to a first main electrode pad 212a-2 via a wired structure 230-2.

Consequently, the signal B will be outputted to the first main electrode pad 212a-1 of the first semiconductor chip 210-1 via the first wire 244a of the second bonding wire 244.

As shown in FIG. 5, the signal B is outputted to the second electrode pad 214b-1 of the first electrode pad 214 via the first conversion wire 236a-1 that is connected to the first main electrode pad 212a-1.

The signal B that is outputted to the second electrode pad 214b-1 will be outputted to the second sub bonding pad 204b of the first bonding pad 204 via the second wire 242b of the first bonding wire 242.

The signal B outputted to the second sub bonding pad 204b will be outputted to the external terminal 209 via the embedded via 208.

In the same way, the signal B will be outputted to the third main electrode pad 212c-2 via the wired structure 230-2.

Consequently, the signal B will be outputted to the third main electrode pad 212c-1 of the first semiconductor chip 210-1 via the third wire 244c of the second bonding wire 244.

As shown in FIG. 5, the signal B is outputted to the third electrode pad 214c-1 of the first electrode pad 214 via the second conversion wire 236b-1 that is connected to the third main electrode pad 212c-1.

The signal B that is outputted to the third electrode pad 214c-1 will be outputted to the third sub bonding pad 204c of the first bonding pad 204 via the third wire 242c of the first bonding wire 242.

The signal B outputted to the third sub bonding pad 204c will be outputted to the external terminal 209 via the embedded via 208.

In the same way, the signal B will be outputted to the fifth main electrode pad 212e-2 via the wired structure 230-2.

Consequently, the signal B will be outputted to the fifth main electrode pad 212e-1 of the first semiconductor chip 210-1 via the fifth wire 244e of the second bonding wire 244.

As shown in FIG. 5, the signal B is outputted to the fourth electrode pad 214d-1 of the first electrode pad 214 via the third conversion wire 236c-1 that is connected to the fifth main electrode pad 212e-1.

The signal B that is outputted to the fourth electrode pad 214d-1 will be outputted to the fourth sub bonding pad 204d of the first bonding pad 204 via the fourth wire 242d of the first bonding wire 242.

The signal B outputted to the fourth sub bonding pad 204d will be outputted to the external terminal 209 via the embedded via 208.

In the same way, the signal B will be outputted to the seventh main electrode pad 212g-2 via the wired structure 230-2.

Consequently, the signal B will be outputted to the seventh main electrode pad 212g-1 of the first semiconductor chip 210-1 via the fifth wire 244g of the second bonding wire 244.

As shown in FIG. 5, the signal B is outputted to the first electrode pad 214a-1 of the first electrode pad 214 via the fourth conversion wire 236d-1 that is connected to the seventh main electrode pad 212g-1.

The signal B that is outputted to the first electrode pad 214a-1 will be outputted to the first sub bonding pad 204a of the first bonding pad 204 via the first wire 242a of the first bonding wire 242.

The signal B outputted to the first sub bonding pad 204a will be outputted to the external terminal 209 via the embedded via 208.

3) Third Path

A circuit element range 225-2 of the second semiconductor chip 210-2 generates a signal C, and then, the signal C is outputted to the main electrode pads 212b-2, 212d-2, 212f-2, and 212h-2 via the wired structure 230-2.

Consequently, the signal C will be outputted to the second electrode pad 216-2 via a second interconnection 234-2 that is connected to the main electrode pads 212b-2, 212d-2, 212f-2, and 212h-2.

The signal C that is outputted to the second electrode pad 216-2 will be outputted to the second bonding pad 205 of the substrate 200 via the third bonding wire 248.

The signal C that is outputted to the second bonding pad 205 will be outputted to the external terminal 209 via the embedded via 208.

4) Fourth Path

A signal D is generated by the circuit element range 225-1 of the first semiconductor chip 210-1, and the signal D will be outputted to any one of the second main electrode pads 212b-1, 212d-1, 212f-1, and 212h-1 via the wired structure 230-1.

The signal D that is outputted to any one of the second main electrode pads 212b-1, 212d-1, 212f-1, and 212h-1 via the wired structure 230-1 will be outputted to the main electrode pad 212-2 of the second semiconductor chip 210-2 via the second bonding wire 244 that is connected to these main electrode pads 212b-1, 212d-1, 212f-1, and 212h-1.

The signal D that is outputted to the main electrode pad 212-2 will be outputted to the second electrode pad 216-2 via the second interconnection 234-2 that is connected to the main electrode pad 212-2.

The signal D that is outputted to the second electrode pad 216-2 will be outputted to the second bonding pad 205 of the substrate 200 via the third bonding wire 248.

The signal D that is outputted to the second bonding pad 205 will be outputted to the external terminal 209 via the embedded via 208.

In addition to the same effects as those of the semiconductor device according to the first embodiment, the configuration of the semiconductor device of the present embodiment is provide with, for example, a conversion circuit capable of outputting the outputted signal to be outputted to a certain main electrode pad to the arbitrary and preferable first electrode pad that has been selected in advance. Accordingly, it is possible to increase a degree of freedom in the arrangement of the bonding pads on the substrate, on which the semiconductor chip is mounted. In other words, in accordance with the positions of the bonding pads on the substrate, a certain outputted signal can be outputted. Accordingly, the semiconductor device of the present embodiment can be easily mounted on the general-purpose substrate, so that the present embodiment may also contribute to decrease in the manufacturing cost of the semiconductor device.

(Third Embodiment)

A constituent example of a semiconductor chip 310 according to the third embodiment of the present invention will be described with reference to FIG. 9.

Figure 9A:
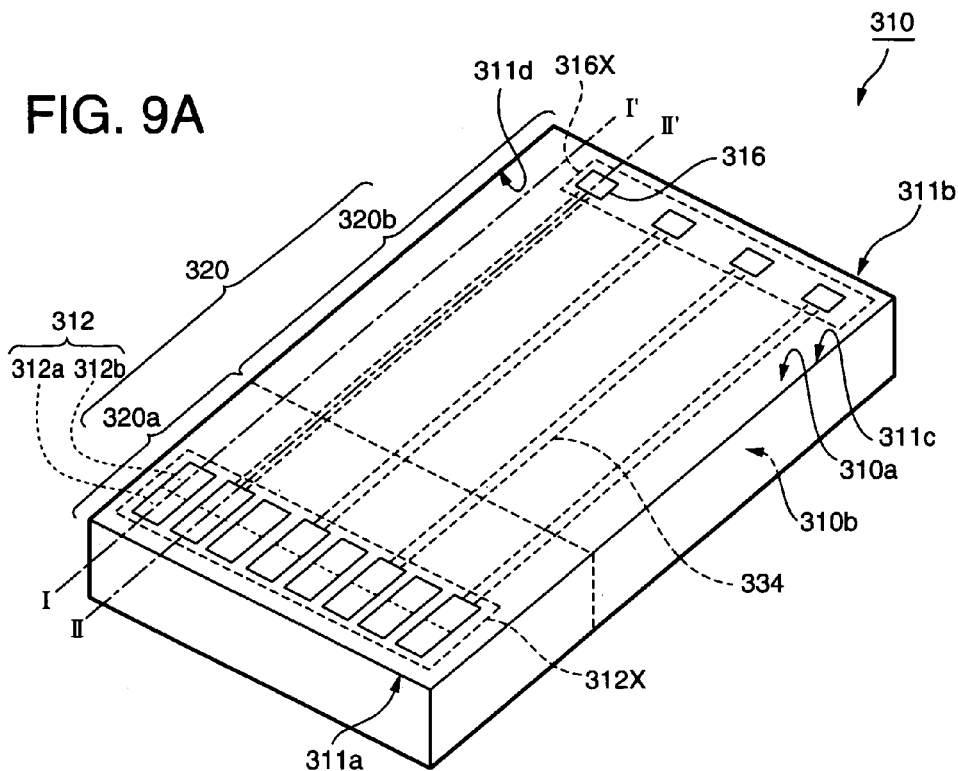
FIGS. 9A, 9B and 9C are schematic views explaining an example of arrangement relations of the semiconductor chip according to a third embodiment of the present invention.

FIG. 9A is a schematic perspective view for explaining the arrangement relation of the constituent element of the semiconductor chip 310.

Figure 9B:
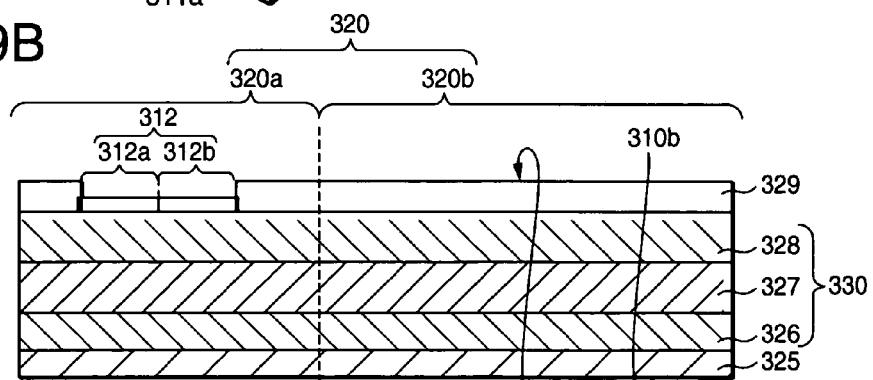
Figure 9C:
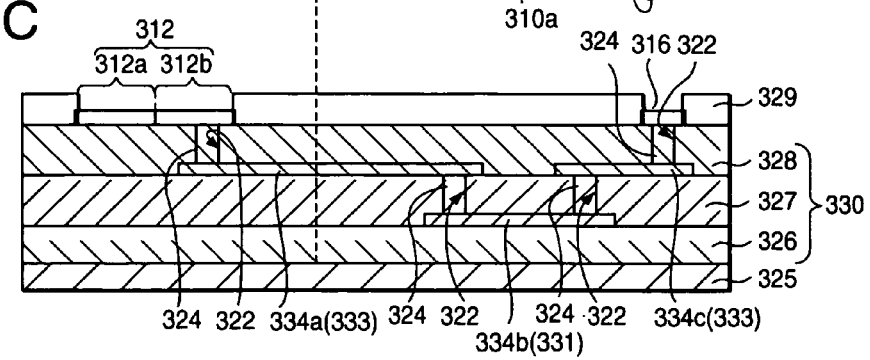

FIG. 9B is a pattern diagram for showing a cut surface taken on a dashed line represented by I–I' in FIG. 9A. In addition, FIG. 9C is a pattern diagram for showing a cut surface taken on a dashed line represented by II–II' in FIG. 9A.

3-1. A Structure of a Semiconductor Chip

The semiconductor chip 310 according to the third embodiment is characterized only in the shape of the first main electrode pad 312, and the other constituent elements are identical with those of the semiconductor chip 110 according to the first embodiment.

Accordingly, this first main electrode pad 312 will be mainly described below, and the reference numerals having the same lower two digits are given to the same structures as the first embodiment and their detailed explanations are herein omitted.

A main electrode pad group 312X is arranged in the vicinity of a first end edge 311a and in parallel with the first end edge 311a. This main electrode pad group 312X may include a plurality of main electrode pads 312.

The plural main electrode pads 312 are provided in an area that is sufficiently wide, to which two bonding wires can be connected. The shape of the main electrode pad 312 is not particularly limited, however, the shape thereof is preferably rectangular and the main electrode pad 312 is disposed on a main surface 310a of a semiconductor chip 310 so that its side edge, namely, a longer direction is elongated in a direction orthogonal to the first side edge 311a.

The main electrode pad 312 integrally has a first partial range 312a (hereinafter, also referred to as a first partial main electrode pad 312a) located at the first side edge 311a and a second partial range 312b (hereinafter, also referred to as a second partial main electrode pad 312b) located at the second side edge 311b, which adjoins and is directly linked to the first partial range 312a. The bonding wire is connected to each of these first partial ranges 312a and second partial ranges 312b one by one.

A second electrode pad group 316X may include a plurality of second electrode pads 316. These second electrode pads 316 are arranged along a second end edge 311b.

The plural second electrode pads 316 are provided as an area, to which one bonding wire can be connected.

According to the present constituent example, the second electrode pad 316 is formed in a square.

According to the configuration of the semiconductor chip of the present embodiment, it is possible to make the semiconductor chip more compact since the configuration equivalent to the first interconnection according to the first embodiment is not necessary as well as obtaining the same effects as those of the semiconductor chip according to the first embodiment.

3-2. Semiconductor Device

A constituent example of the semiconductor device having the layer structure with the semiconductor chips 310 of the third embodiment according to the present invention laminated will be described below with reference to FIG. 10.

The pattern of the layer structure of the semiconductor device of the present embodiment is substantially identical with that of the semiconductor device according to the first embodiment except for the connection relation between the main electrode pad 312 and the bonding wire, so that only the connection between each of the plural main electrode pads 312 and each bonding wire will be explained here.

Figure 10A:
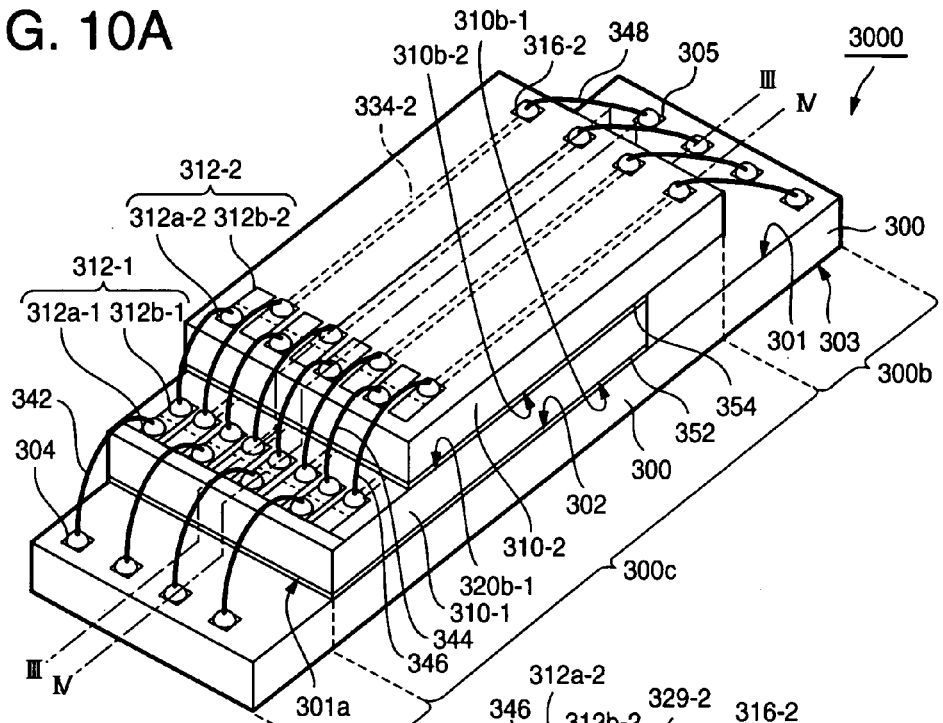
FIGS. 10A, 10B, and 10G show examples of lamination of the semiconductor chips according to the third embodiment of the present invention.

FIG. 10A is a schematic perspective view for explaining a semiconductor device 3000 having the layer structure with two semiconductor chips 310 laminated.

Figure 10B:
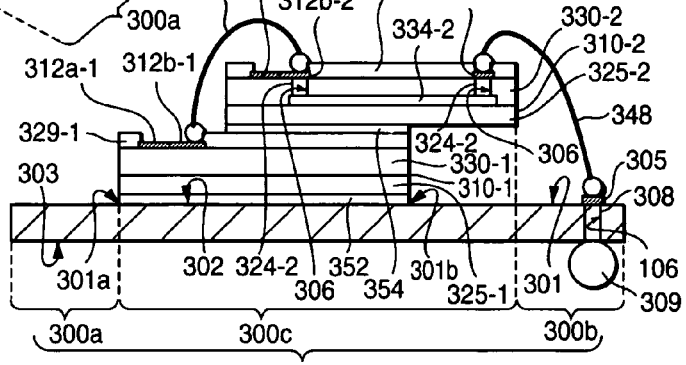
Figure 10C:
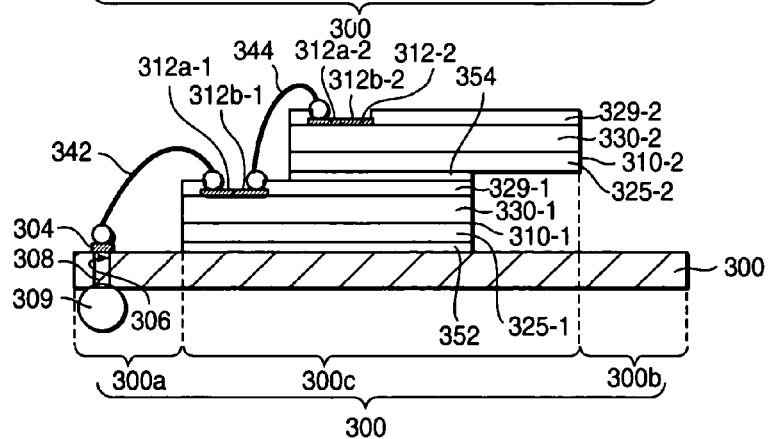

FIG. 10B is a pattern diagram for showing a cut surface taken on a dashed line represented by III–III' in FIG. 10A. In addition, FIG. 10C is a pattern diagram for showing a cut surface taken on a dashed line represented by IV–IV' in FIG. 10A.

A first bonding wire 342 serves to connect a first electrode 304 of the substrate 300 with a first partial main electrode pad 312a-1 of a first semiconductor chip 310-1 one-on-one. These first bonding wires 342 have the same lengths.

A second bonding wire 344 serves to connect a second partial main electrode pad 312b-1 adjoining the first partial main electrode pad 312a-1, which is connected to the first bonding wire 342 of the first semiconductor chip 310-1, with a first partial main electrode pad 312a-2 of a second semiconductor chip 310-2. These second bonding wires 344 have the same lengths.

A third bonding wire 346 serves to connect a second partial main electrode pad 312b-1, in which the first bonding wire is not connected to the first partial main electrode pad 312a-1 of the first semiconductor chip 310-1, with a second partial main electrode pad 312b-2 of the second semiconductor chip 310-2. These third bonding wires 346 have the same lengths.

Each of fourth bonding wires 348 has the same length and they may connect a second electrode pad 316-2 of the second semiconductor chip 310-2 with a second bonding pad 305 of the substrate 300.

Further, since the same signals are outputted from the first partial range 312a and the second partial range 312b, or the same signals can be inputted in these first partial main electrode pad 312a and the second partial main electrode pad 312b, particularly, any of the above-described bonding wire to be bonded to the second partial main electrode pad 312b-2 of the second semiconductor chip 310-2 can be bonded on the first partial main electrode pad 312a-2.

According to such a configuration, as same as the first embodiment, the electric short circuit due to the contact between the bonding wires each other can be effectively prevented. Accordingly, it is possible to provide a semiconductor device having a high reliability. In addition, it is possible to make the semiconductor device compact.

3-3. Operation

Here, with reference to FIG. 10 again, the operation of a semiconductor device 3000 will be described.

The semiconductor device 3000 according to the present embodiment can output the signals to the external device through four paths as same as the first embodiment. With respect to the case that the signals are inputted in the semiconductor chip 310, as same as the first embodiment, its explanation is herein omitted.

1) First Path

A signal A generated in a circuit element range 325-1 of the first semiconductor chip 310-1 is outputted to a main electrode pad 312-1, namely, the first main electrode pad 312a-1 via a wired structure 330-1.

The signal A that is outputted to the first partial main electrode pad 312a-1 will be outputted to the first electrode 304 of the substrate 300 via the first bonding wire 342.

The signal A that is outputted to the first bonding pad 304 will be outputted to an external terminal 309 via an embedded via 308.

2) Second Path

A signal B that is generated in a circuit element range 325-2 of the second semiconductor chip 310-2 will be outputted to a main electrode pad 312-2, namely, first and second partial main electrode pads 312a-2 and 312b-2 via a wired structure 330-2.

The signal B that is outputted to the first partial main electrode 312a-2 will be outputted to a main electrode pad 312-1 of the first semiconductor chip 310-1, namely, the first and second partial main electrodes 312a-1 and 312b-1 via the second bonding wire 344.

The signal B that is outputted to the second partial main electrode 312b-2 will be outputted to the first bonding pad 304 of the substrate 300 via the first bonding wire 342.

The signal B that is outputted to the first bonding pad 304 will be outputted to the external terminal 309 via the embedded via 308.

3) Third Path

A signal C that is generated in the circuit element range 325-2 of the second semiconductor chip 310-2 will be outputted to the main electrode pad 312-2, namely, the first and second partial main electrodes 312a-2 and 312b-2 via the wired structure 330-2.

Consequently, the signal C that is outputted to the main electrode pad 312-2 will be outputted to the second electrode pad 316-2 via a second interconnection 334-2 that is connected to this main electrode pad 312-2.

The signal C that is outputted to the second electrode pad 316-2 will be outputted to a second bonding pad 305 of the substrate 300 via a fourth bonding wire 348.

The signal C that is outputted to the second bonding pad 305 will be outputted to the external terminal 309 via the embedded via 308.

4) Fourth Path

A signal D generated in the circuit element range 325-1 of the first semiconductor chip 310-1 is outputted to the main electrode pad 312-1, namely, the first and second partial main electrodes 312a-1 and 312b-1 via the wired structure 330-1.

The signal D that is outputted to the main electrode pad 312-1 will be outputted to the main electrode pad 312-2 of the second semiconductor chip 310-2, namely, the first and second partial main electrodes 312a-2 and 312b-2 via the third bonding wire 346 that is connected to the main electrode pad 312-1.

Consequently, the signal D that is outputted to the main electrode pad 312-2 will be outputted to the second electrode pad 316-2 via the second interconnection 334-2 that is connected to this main electrode pad 312-2.

The signal D that is outputted to the second electrode pad 316-2 will be outputted to the second bonding pad of the substrate 300 via the fourth bonding wire 348.

The signal D that is outputted to the second bonding pad 305 will be outputted to the external terminal 309 via the embedded via 308.

Figure 11:
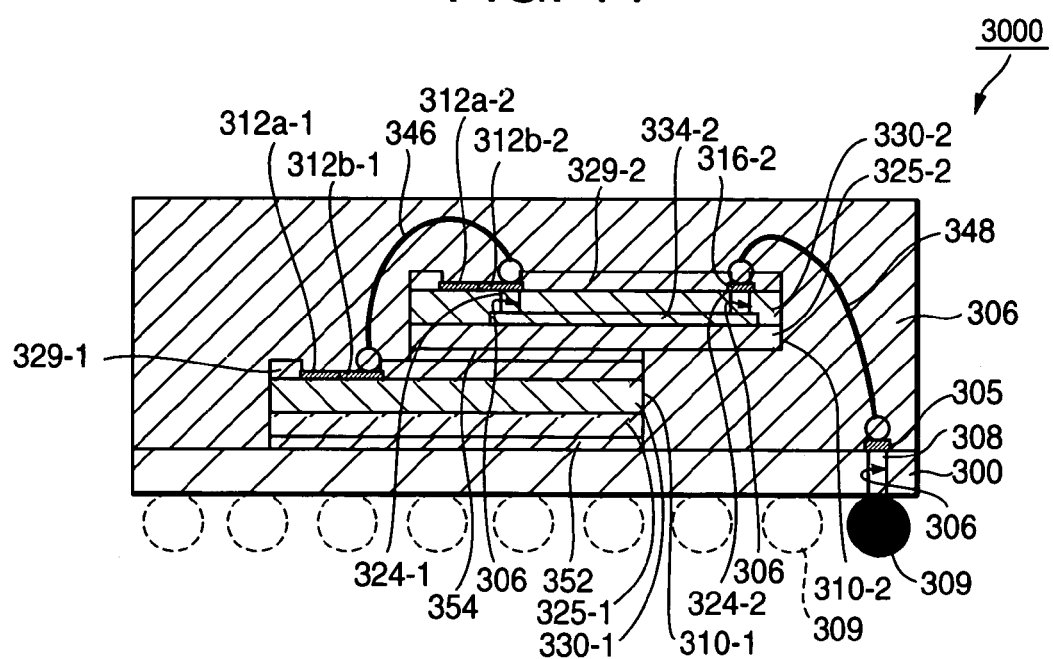
FIG. 11 shows an example of packaging of the semiconductor chips according to the third embodiment of the present invention.

Since the constituent examples and the manufacturing processes of the package example of the semiconductor device according to the second embodiment shown in FIG. 11 are substantially identical with those of the above-described first embodiment, their detailed descriptions are herein omitted.

According to such a configuration of the present embodiment, in addition to the same effect as that of the semiconductor device according to the first embodiment, the semiconductor device can be made more compact.

(Fourth Embodiment)

A constituent example of a semiconductor chip 410 according to the fourth embodiment of the present invention will be described with reference to FIG. 12.

Figure 12A:
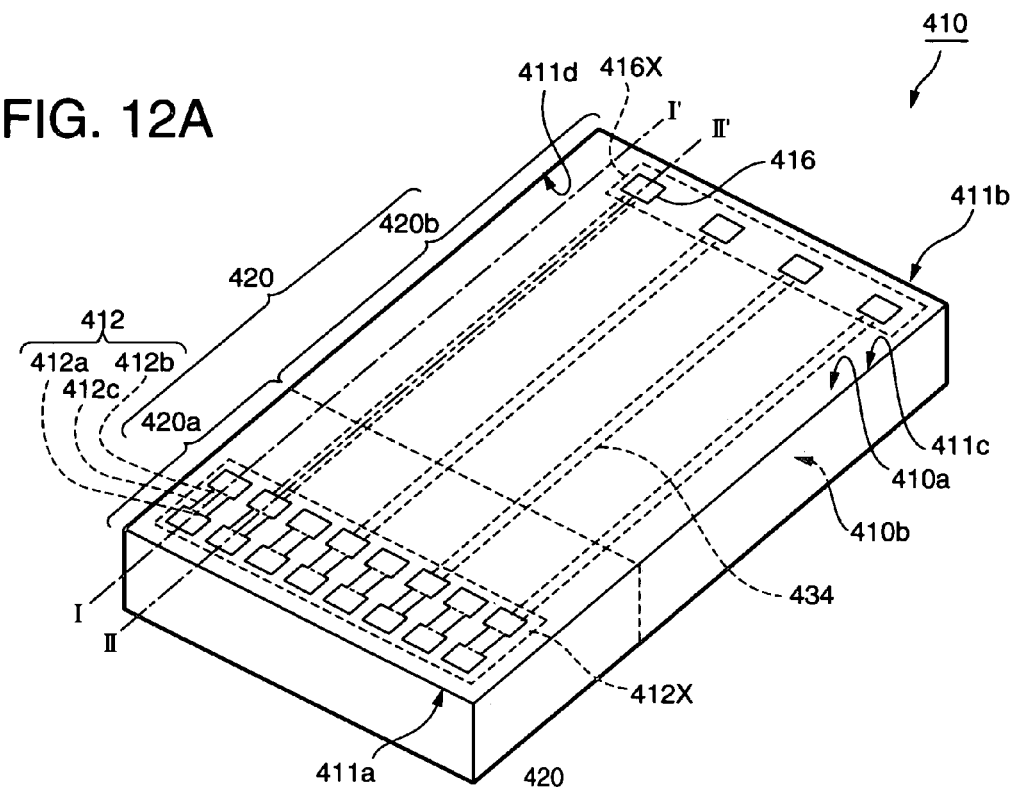
FIGS. 12A, 12B, and 12C are schematic views explaining an example of arrangement relations of the semiconductor chip according to a fourth embodiment of the present invention.

FIG. 12A is a schematic perspective view for explaining the arrangement relation of the constituent element of the semiconductor chip 410.

Figure 12B:
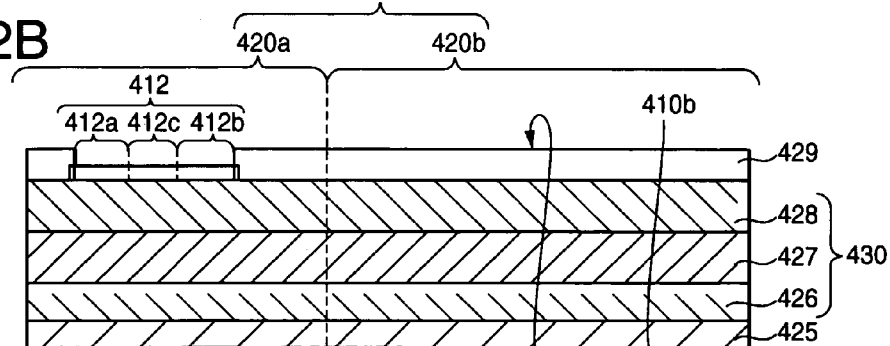
Figure 12C:
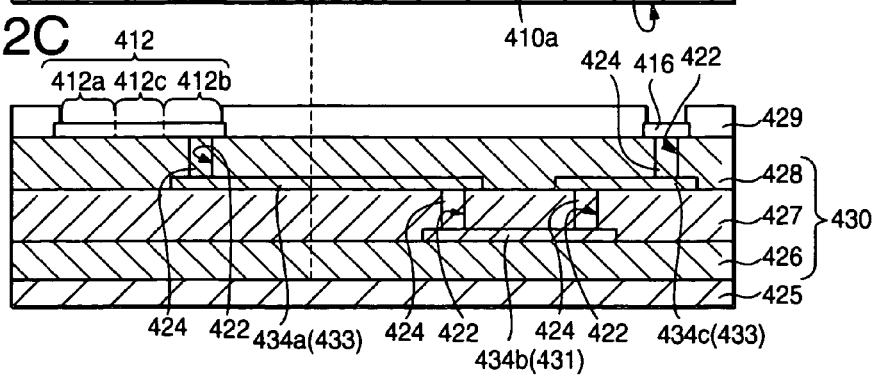

FIG. 12B is a pattern diagram for showing a cut surface taken on a dashed line represented by I–I' in FIG. 12A. In addition, FIG. 12C is a pattern diagram for showing a cut surface taken on a dashed line represented by II–II' in FIG. 12A.

4-1. Structure of Semiconductor Chip

The semiconductor chip 410 according to the fourth embodiment has the approximate same configuration of the semiconductor chip 310 according to the third embodiment. In other words, the semiconductor chip 410 according to the fourth embodiment is characterized only in the shape of the first main electrode pad 412, and the other constituent elements are identical with those of the semiconductor chips 110 and 310 according to the first and third embodiments.

Accordingly, this first main electrode pad 412 will be mainly described below, and the reference numerals having the same lower two digits are given to the same structures as the first to third embodiments and their detailed explanations are herein omitted.

A main electrode pad group 412X is arranged in the vicinity of a first end edge 411a and in parallel with the first end edge 411a. This main electrode pad group 412X may include a plurality of main electrode pads 412.

The main electrode pad 412 has a first partial range 412a located at the side of a first partial edge 411a (hereinafter, also referred to as a first partial main electrode pad 412a) and a second partial range 412b (hereinafter, also referred to as a second partial main electrode pad 412b). The second partial range 412b is connected to the first partial main electrode pad 412a by a connection area 412c formed in a narrower width than the widths of these first and second partial electrode pads in a direction orthogonal to the first end edge 411a.

In other words, the main electrode pad 412 is disposed on a main surface 410a of the semiconductor chip 410 as elongated in a direction orthogonal to the first end edge 411a.

In other words, the main electrode pad 412 has a narrower partial range as the connection area 412c, which is formed in such a manner that the first partial range 312a and the second first partial range 312b are made cut on the main electrode pad 312 that has been described in the third embodiment and is narrowed by this cutting.

The bonding wire is connected to each of these first partial ranges 412a and second partial ranges 412b (the first partial range 412a and the second partial range 412b) one by one.

According to the configuration of the semiconductor chip of the present embodiment, it is possible to obtain the same effects as those of the semiconductor chip according to the first embodiment.

4-2. Semiconductor Device

A constituent example of the semiconductor device having the layer structure with the semiconductor chips 410 of the fourth embodiment according to the present invention laminated in three layers will be described below with reference to FIG. 13.

Figure 13A:
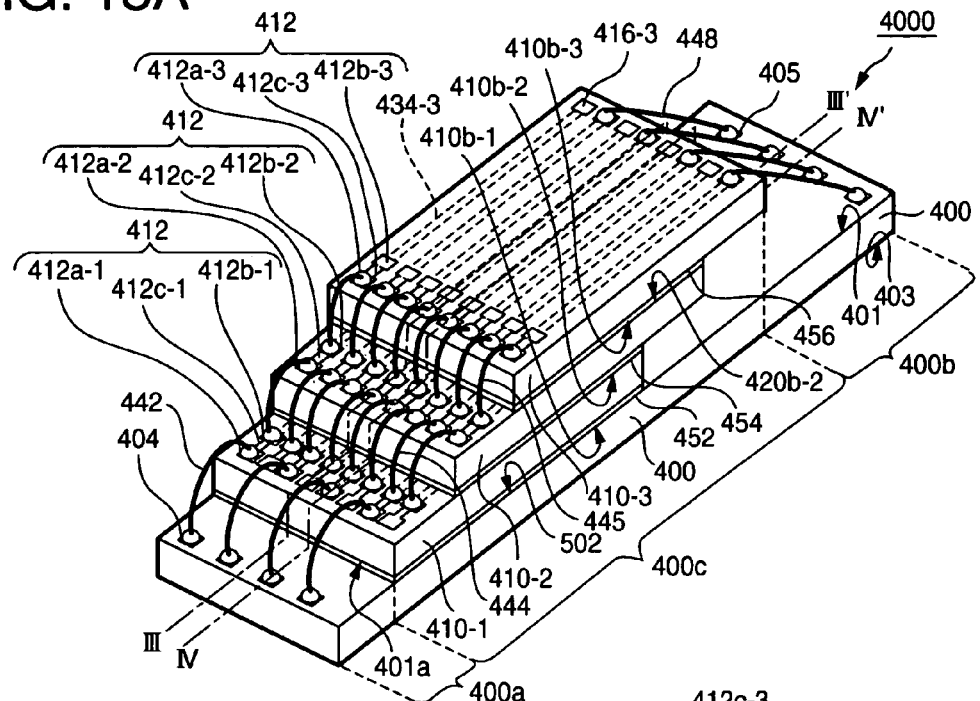
FIGS. 13A, 13B, and 13C show examples of lamination of the semiconductor chips according to the fourth embodiment of the present invention.

FIG. 13A is a schematic perspective view for explaining a semiconductor device 4000 having the layer structure with three semiconductor chips 410 laminated.

Figure 13B:
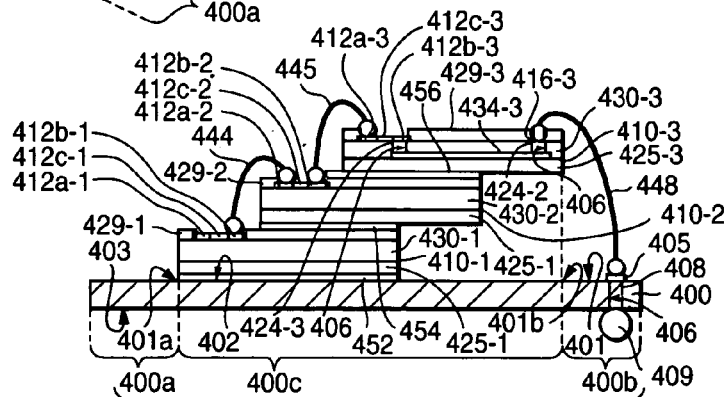
Figure 13C:
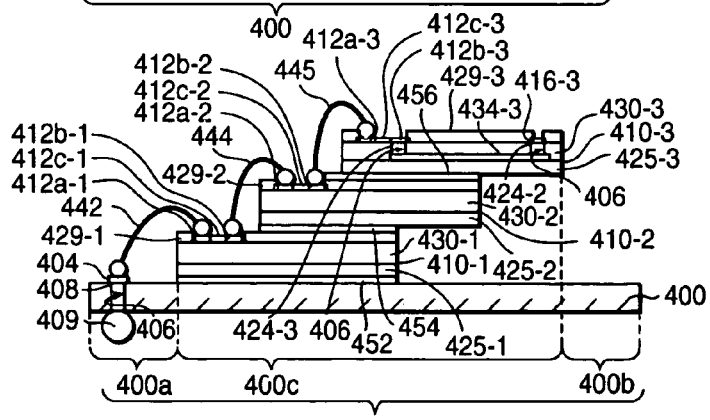

FIG. 13B is a pattern diagram for showing a cut surface taken on a dashed line represented by III–III' in FIG. 13A. In addition, FIG. 13C is a pattern diagram for showing a cut surface taken on a dashed line represented by IV–IV' in FIG. 13A.

Each of first bonding wires 442 serves to connect a first electrode 404 of the substrate 400 with a first partial main electrode pad 412a-1 of a first semiconductor chip 410-1, respectively. These first bonding wires 442 have the same lengths.

Each of second bonding wires 444 serves to connect a second partial main electrode pad 412b-1 with a first partial main electrode pad 412a-2 of a second semiconductor chip 410a-2, respectively. These second bonding wires 444 have the same lengths.

Each of third bonding wires 445 serves to connect a second partial main electrode pad 412b-2 of a second semiconductor chip 410-2 with a first partial main electrode pad 412a-3 of a third semiconductor chip 410-3, respectively. These third bonding wires 445 have the same lengths.

Each of fourth bonding wires 448 has the same length and they may connect a second electrode pad 416-3 of the third semiconductor chip 410-3 with a second bonding pad 405 of the substrate 400.

Further, since the same signals are outputted from the first partial range 412a and the second partial range 412b, or the same signals can be inputted in these first partial main electrode pad 412a and the second partial main electrode pad 412b, particularly, any of the above-described bonding wire that is only bonded to a second partial main electrode pad 412b-3 of the third semiconductor chip 410-3 can be bonded any of the first or second partial main electrode pads 412a-3 or 412b-3.

The layer pattern of the layer structure according to the present embodiment is substantially identical with that of the semiconductor device described in the first to third embodiments with the exception of the fact that three semiconductor chips 410 are laminated.

The third semiconductor chip 410-3 are laminated on a laminated area 420b-2 of the second semiconductor chip 410-2 as bonded by a third dice bond material 456. As the third dice bond material 456, the same material as the above-described second dice bond material can be used.

In addition, as same as the first to third embodiments, the two semiconductor chips 410 may be laminated.

Figure 14:
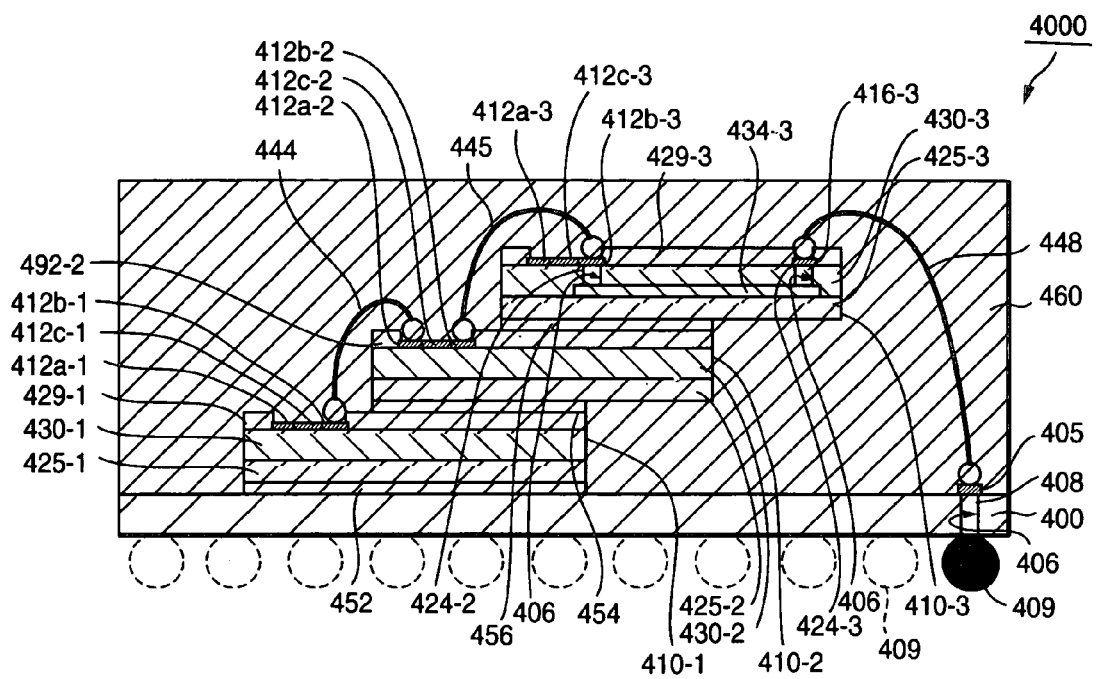
FIG. 14 shows an example of packaging of the semiconductor chips according to the fourth embodiment of the present invention.

FIG. 14 illustrates a constituent example of package, in which the semiconductor device 4000 described with reference to FIG. 13 by a sealing resin. Further, FIG. 14 is a pattern diagram for showing a cut surface of the semiconductor device 4000 taken on the same position as FIG. 13B.

Since the constituent elements and the manufacturing processes of the package example of the semiconductor device according to the fourth embodiment shown in FIG. 14 are substantially identical with those of the first embodiment that has been described, their detailed explanation will be omitted here.

According to the configuration of the semiconductor device of the present embodiment, it is possible to effectively prevent the occurrence of the electric short circuit due to the contact between the bonding wires each other as same as the first embodiment. In addition, it is possible to obtain a highly functional and highly integrated semiconductor device. In addition, in the wire bonding process, since the first and second partial main electrode pads are separated by the connection area, the bonding device can easily recognize each electrode pad, the bonding device can perform the bonding for these electrode pads more assuredly.

4-3. Operation

Here, with reference to FIG. 13 again, the operation of the semiconductor device 4000 will be described.

The semiconductor device 4000 according to the present embodiment can output the signals to the external device through six paths. With respect to the case that the signals are inputted in the semiconductor chip 410, as same as the first embodiment, its explanation is herein omitted.

1) First Path

A signal A generated in a circuit element range 425-1 of the first semiconductor chip 410-1 is outputted to a main electrode pad 412-1, namely, the first main electrode pad 412a-1 via a wired structure 430-1.

The signal A that is outputted to the first partial main electrode pad 412a-1 will be outputted to the first bonding pad 404 of the substrate 400 via the first bonding wire 442.

The signal A that is outputted to the first bonding pad 404 will be outputted to an external terminal 409 via an embedded via 408.

2) Second Path

A signal B that is generated in a circuit element range 425-2 of the second semiconductor chip 410-2 will be outputted to a main electrode pad 412-2, namely, first and second partial main electrode pads 412a-2 and 412b-2 via a wired structure 430-2.

The signal B that is outputted to the first partial main electrode 412a-2 will be outputted to a main electrode pad 412-1 of the first semiconductor chip 410-1, namely, the first and second partial main electrodes 412a-1 and 412b-2 via the second bonding wire 444.

The signal B that is outputted to the second partial main electrode 412b-1 will be outputted to the first bonding pad 404 of the substrate 400 via the first bonding wire 442.

The signal B that is outputted to the first bonding pad 404 will be outputted to the external terminal 409 via the embedded via 408.

3) Third Path

A signal C that is generated in a circuit element range 425-3 of the third semiconductor chip 410-3 will be outputted to a main electrode pad 412-3, namely, the first and second partial main electrodes 412a-3 and 412b-3 via a wired structure 430-3.

The signal C outputted to the main electrode pad 412-3 will be outputted to the main electrode pad 412-2 of the second semiconductor chip 410-2, namely, the first and second partial main electrode pads 412a-2 and 412b-2 via a third bonding wire 445.

The signal C outputted to the main electrode pad 412-2 will be outputted to the main electrode pad 412-1 of the second semiconductor chip 410-1 namely, the first and second partial main electrode pads 412a-1 and 412b-1 via the second bonding wire 444.

The signal C outputted to the main electrode pad 412-1 will be outputted to the first bonding pad 404 of the substrate 400 via the first bonding wire 442.

The signal C that is outputted to the first bonding pad 404 will be outputted to the external terminal 409 via the embedded via 408.

4) Fourth Path

A signal D that is generated in the circuit element range 425-3 of the third semiconductor chip 410-3 will be outputted to the main electrode pad 412-3, namely, the first and second partial main electrodes 412a-3 and 412b-3 via the wired structure 430-3.

Consequently, the signal D outputted to the main electrode pad 412-3 will be outputted to the second electrode pad 416-3 via a second interconnection 434-3 that is connected to the main electrode pad 412-3.

The signal D outputted to the second electrode pad 416-3 will be outputted to the second bonding pad 405 of the substrate 400 via the fourth bonding wire 448.

The signal D that is outputted to the second bonding pad 405 will be outputted to the external terminal 409 via the embedded via 408.

5) Fifth Path

A signal E that is generated in the circuit element range 425-2 of the third semiconductor chip 410-2 will be outputted to the main electrode pad 412-2, namely, the first and second partial main electrodes 412a-2 and 412b-2 via the wired structure 430-2.

The signal E outputted to the main electrode pad 412-2 will be outputted to the main electrode pad 412-3 of the third semiconductor chip 410-3, namely, the first and second partial main electrodes 412a-3 and 412b-3 via the third bonding wire 445 that is connected to the main electrode pad 412-2.

Consequently, the signal E outputted to the main electrode pad 412-3 will be outputted to the second electrode pad 416-3 via the second interconnection 434-3 that is connected to the main electrode pad 412-3.

The signal E outputted to the second electrode pad 416-3 will be outputted to the second bonding pad 405 of the substrate 400 via the fourth bonding wire 448.

The signal E that is outputted to the second bonding pad 405 will be outputted to the external terminal 409 via the embedded via 408.

6) Sixth Path

A signal F that is generated in the circuit element range 425-1 of the first semiconductor chip 410-1 will be outputted to the main electrode pad 412-1, namely, the first and second partial main electrodes 412a-1 and 412b-1 via the wired structure 430-1.

The signal F outputted to the main electrode pad 412-1 will be outputted to the main electrode pad 412-2 of the second semiconductor chip 410-2, namely, the first and second partial main electrodes 412a-2 and 412b-2 via the second bonding wire 444 that is connected to the main electrode pad 412-1.

The signal F outputted to the main electrode pad 412-2 will be outputted to the main electrode pad 412-3 of the third semiconductor chip 410-3, namely, the first and second partial main electrodes 412a-3 and 412b-3 via the third bonding wire 445 that is connected to the main electrode pad 412-2.

Consequently, the signal F outputted to the main electrode pad 412-3 will be outputted to the second electrode pad 416-3 via the second interconnection 434-3 that is connected to the main electrode pad 412-3.

The signal F outputted to the second electrode pad 416-3 will be outputted to the second bonding pad 405 of the substrate 400 via the fourth bonding wire 448.

The signal F that is outputted to the second bonding pad 405 will be outputted to the external terminal 409 via the embedded via 408.

(Fifth Embodiment)

A constituent example of a semiconductor chip 510 according to the fifth embodiment of the present invention will be described with reference to FIG. 15.

Figure 15A:
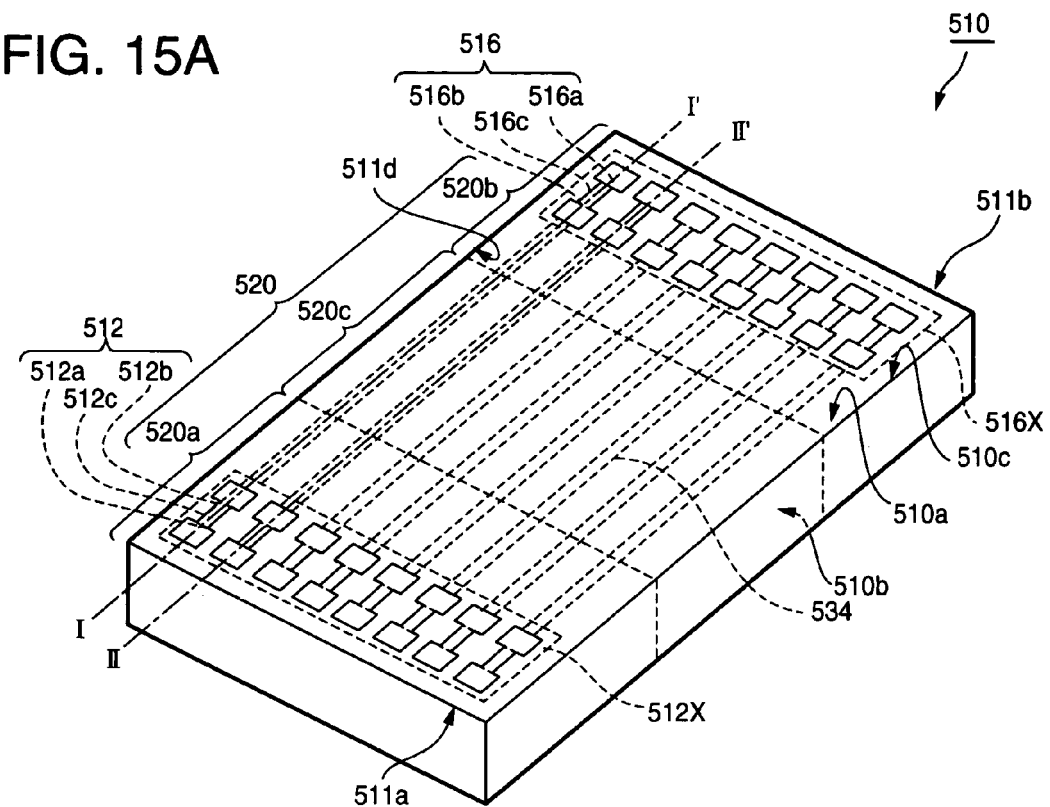
FIGS. 15A and 15B are schematic views explaining an example of arrangement relations of the semiconductor chip according to a fifth embodiment of the present invention.
Figure 15B:
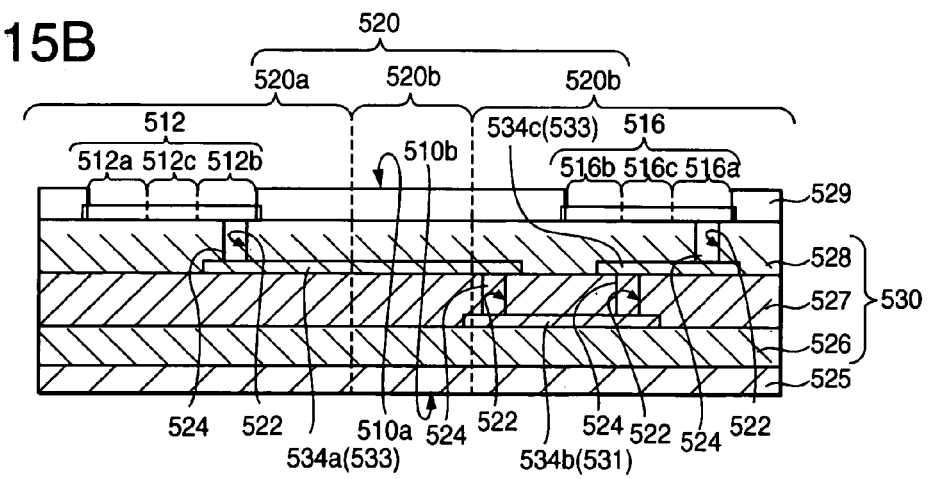

FIG. 15A is a schematic perspective view for explaining the arrangement relation of the constituent element of the semiconductor chip 510. FIG. 15B is a pattern diagram for showing a cut surface taken on a dashed line represented by I–I' in FIG. 15A.

5-1. Structure of Semiconductor Chip

The semiconductor chip 510 according to the fifth embodiment has the approximate same configuration of the semiconductor chip 410 according to the fourth embodiment. In other words, the semiconductor chip 510 according to the fifth embodiment is characterized in the shape of the second electrode pad 516 and the connection relation between the second electrode pad 516 and the first main electrode pad 512, and the other constituent elements are identical with those of the semiconductor chip 410 according to the fourth embodiment.

Accordingly, this second electrode pad 516 will be mainly described below, and the reference numerals having the same lower two digits are given to the same structures as the fourth embodiment and their detailed explanations are herein omitted.

A second electrode pad group 516X is arranged in the vicinity of a second side 511b and in parallel with the second end edge 511b. This second electrode pad group 516X may include a plurality of second electrode pads 516.

According to the present embodiment, the second electrode pads 516 as many as the main electrode pads 512 are provided on a main surface 510a of the semiconductor chip 510. The second electrode pads 516 are disposed corresponding to each of the main electrode pads 512 one-on-one in a direction orthogonal to the first and second end edges.

The main electrode pads 512 are connected to the second electrode pads 516 one-on-one by interconnections 534. In other words, the main electrode pads 512, the second electrode pads 516, and the interconnections 534 are disposed in the same number, respectively.

The second electrode pad 516 has a first partial range 516a (hereinafter, also referred to as a first partial electrode pad 516a) located at the side of the second end edge 511b and a second partial range 516b (hereinafter, also referred to as a second partial electrode pad 516b), which adjoins and is directly linked to the first partial range 516a. The second partial electrode pad 516b is connected to the first partial electrode pad 516a through a connection area 516c so as to be elongated from the first partial electrode pad 516a in a direction orthogonal to the second end edge 51b.

The second partial electrode pad 516b is connected to the first partial electrode pad 516a through a connection area 516c that is narrow than the widths of these first and second partial electrode pads in the direction orthogonal to the second side 51b.

In other words, the second electrode pad 516 is provided so as to be elongated in the direction orthogonal to the second end edge 51b.

It is possible to connect the bonding wire to each of these first partial electrode pads 516a and second partial electrode pads 516b one by one.

In the semiconductor chip 510 according to the present constituent example, a first range 520a exposed from the other semiconductor chip when the other semiconductor chip is laminated and including the main electrode pad group 112X and the first electrode pad group 114X, a second range 520b including a second electrode pad group, and a third range 520c clipped between these first range 520a and second range 520b and contacting them are provided.

The other semiconductor chip may be mounted across any one of these third range 520c, first range 520a, and second range 520b.

According to the configuration of the semiconductor chip of the present embodiment, it is possible to obtain the same effects as those of the first embodiment. In addition, since the signals to be outputted from the main electrode pad can be outputted to the both of the main electrode pad 512 and the second electrode pad by the interconnection 534, it is possible to increase a degree of freedom in the arrangement of the bonding pads on the substrate.

5-2. Semiconductor Device

Figure 16:
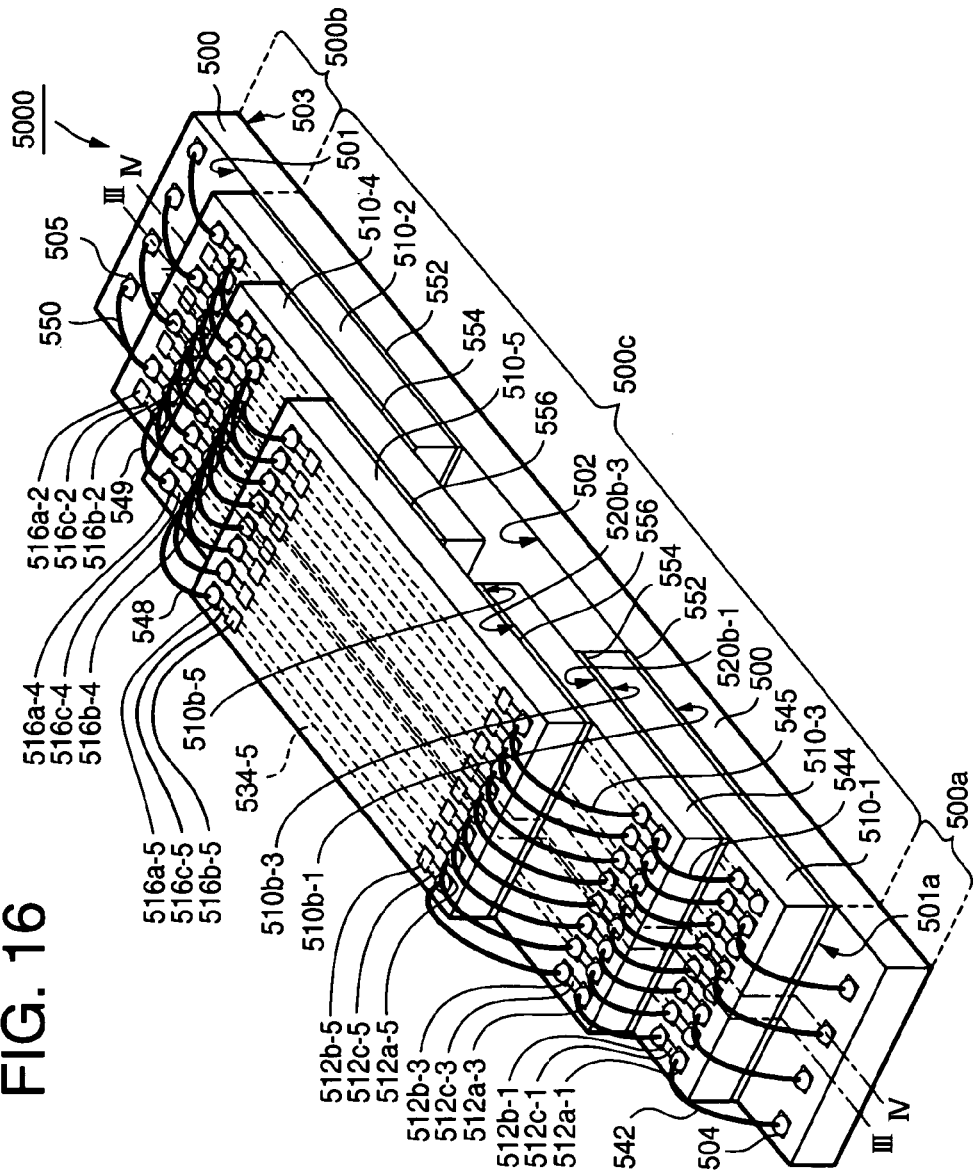
FIG. 16 shows an example of lamination of the semiconductor chips according to the fifth embodiment of the present invention.

With reference to FIG. 16 and FIG. 17, the constituent example of the layer structure, in which five semiconductor chips 510 according to the fifth embodiment of the present invention are laminated in an inversed V-shape, will be described below. Further, the reference numerals having the same lower two digits are given to the same structures as the above-described embodiments and their detailed explanations are herein omitted.

FIG. 16 is a schematic perspective view for explaining a semiconductor device 5000 having the layer structure with five semiconductor chips 510 laminated.

Figure 17A:
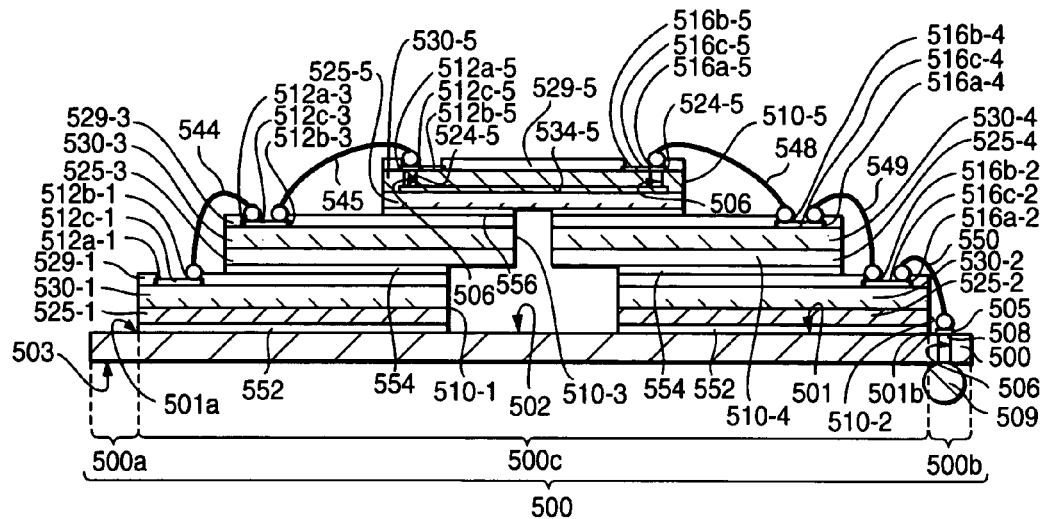
FIGS. 17A and 17B show examples of lamination of the semiconductor chips according to the fifth embodiment of the present invention.
Figure 17B:
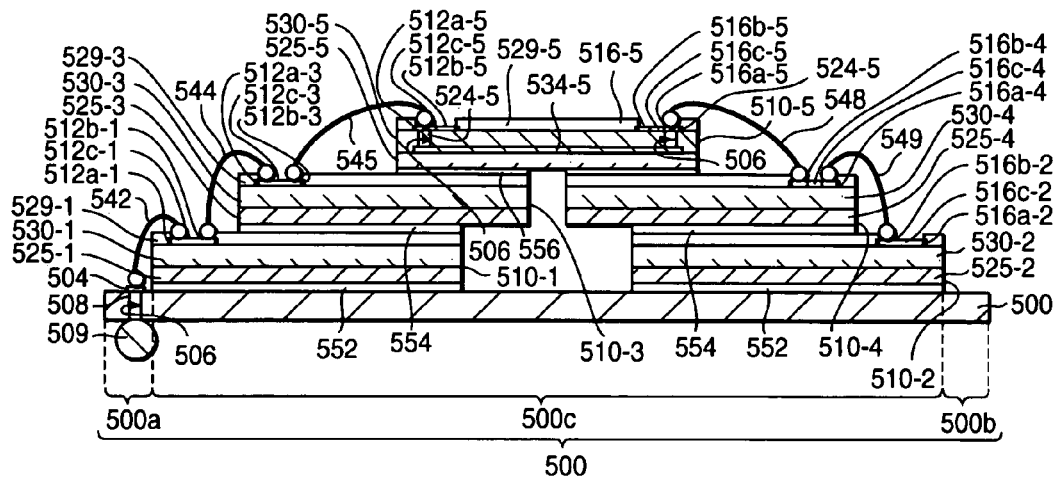

FIG. 17A is a pattern diagram for showing a cut surface taken on a dashed line represented by III–III' in FIG. 16. In addition, FIG. 17B is a pattern diagram for showing a cut surface taken on a dashed line represented by IV–IV' in FIG. 16.

The semiconductor device 5000 may include a substrate 500 at its lowest layer. In the semiconductor device 5000 according to the present embodiment, five semiconductor chips 510 are laminated on a semiconductor chip mounted range 502 of the above-described substrate 500 in the inverted V-shape, and the layers are entirely shaped in the inversed V-shape.

The semiconductor chip mounted range 502 is provided in a sufficiently wide space (area) so that two semiconductor chips 510 can be located at enough intervals in order to layer five semiconductor devices in the inverted V-shape.

The first semiconductor chip 510-1 having the above-described configuration may be bonded and mounted on the substrate 500 by a first dice bond material 552 with its first end adjusted to a first side 501a of the range 502.

A second semiconductor chip 510-2 is bonded and mounted on the substrate 500 by the first dice bond material 552 with its second end adjusted to a second side 501b of the range 502. In other words, two semiconductor chips 510-1 and 510-2 are mounted on a semiconductor chip-mounted range 502 (a third range 500c) so that the second end of the first semiconductor chip 510-1 and the first end of the second semiconductor chip 510-2 are separated and opposed, in other words, they are mounted on the semiconductor chip-mounted range 502 (the third range 500c) so that two semiconductor chips turn toward the same direction with the first main surfaces of the semiconductor chips 510-1 and 520-2 are turned up.

Accordingly, on the outside from the first end of the first semiconductor chip 510-1, namely, on the surface range (a first range 500a) of the surface 500 at one end side of the substrate, a first bonding pad 504 is exposed. On the outside from the second end of the second semiconductor chip 510-2 (i.e. the other end side of the substrate), namely, the surface range (a second range 500b) of the substrate 5000, a second bonding pad 505 is exposed.

A third semiconductor chip 510-3 is mounted on the substrate 500 by a second dice bond material 554 with its second main surface 510b-1 bonded on a laminated range 520b-1 (the second range 520b and the third range 520c) of the first semiconductor chip 510-1. The third semiconductor chip 510-3 is mounted on the substrate 500 so that its first side is located at the first side of the first semiconductor chip 510-1.

A fourth semiconductor chip 510-4 is mounted on the substrate 500 by the second dice bond material 554 with its second main surface bonded on the first range 520a and the third range 520c of the second semiconductor chip 510-2. The fourth semiconductor chip 510-4 is mounted on the substrate 500 in the same direction as the second semiconductor chip 510-2 so that its first side is located at the first side of the second semiconductor chip 510-2.

In this time, it is preferable that the second end of the third semiconductor chip 510-3 and the first end of the fourth semiconductor chip 510-4 are separated and opposed at the shortest intervals.

A fifth semiconductor chip 510-5 is mounted on the substrate 500 by a third dice bond material 556 with its second main surface bonded across a laminated range 520b-3 of the third semiconductor chip 510-3 (i.e., the second range 520b and the third range 520c). The fifth semiconductor chip 510-5 is mounted on the substrate 500 so that its first side is located at the first side of the third semiconductor chip 510-3. It is preferable that the fifth semiconductor chip 510-5 is mounted equally across the third semiconductor chip 510-3 and the fourth semiconductor chip 510-4. Thus, the length of the bonding wire can be made equal and the device can be made compact.

In addition, it is preferable that a main electrode pad 512-5 of the fifth semiconductor chip 510-5 is mounted on the first semiconductor chip 510-1 and a second electrode pad 516-5 thereof is mounted on the second semiconductor chip 510-2.

Each of first bonding wires 542 having the same length may connect the first bonding pad 504 of the substrate 500 with a first partial main electrode pad 512a-1 of the first semiconductor chip 510-1, respectively.

Each of second bonding wires 544 having the same length may connect a second main electrode pad 512b-1 of the first semiconductor chip 510-1 with a first partial main electrode pad 512a-3 of the third semiconductor chip 510-3, respectively.

Each of third bonding wires 545 having the same length may connect a second main electrode pad 512b-3 of the third semiconductor chip 510-3 with a first partial main electrode pad 512a-5 of the fifth semiconductor chip 510-5, respectively.

Each of fourth bonding wires 548 having the same length may connect a first partial electrode pad 516a-5 of a second electrode pad 516-5 of the fifth semiconductor chip 510-5 with a second partial electrode pad 516b-4 of the fourth semiconductor chip 510-4, respectively. As described above, it is preferable that the lengths of the third bonding wire 545 and the fourth bonding wire 548 are made the same.

Each of fifth bonding wires 549 having the same length may connect a first partial electrode pad 516a-4 of the fourth semiconductor chip 510-4 with a second partial electrode pad 516b-2 of the second semiconductor chip 510-2, respectively.

Each of sixth bonding wires 550 having the same length may connect a first partial electrode pad 516a-2 of the second semiconductor chip 510-2 with the second partial electrode pad 505 of the substrate 500, respectively.

According to the present example, it is described that each of the semiconductor chips 510 is mounted on the substrate as turned toward the same direction, however, for example, the first and second semiconductor chips 510-1 and 510-2 may be mounted on the third range of the substrate so that the second ends thereof are separated and opposed, and five semiconductor chips are laminated so that the first ranges 520a of all semiconductor chips are exposed.

According to such layering, since the other semiconductor chips are not mounted on the first range 520a, on which the circuit elements having weak tolerance to the stress are integrated, the operation of the semiconductor device can be more stabilized.

Figure 18:
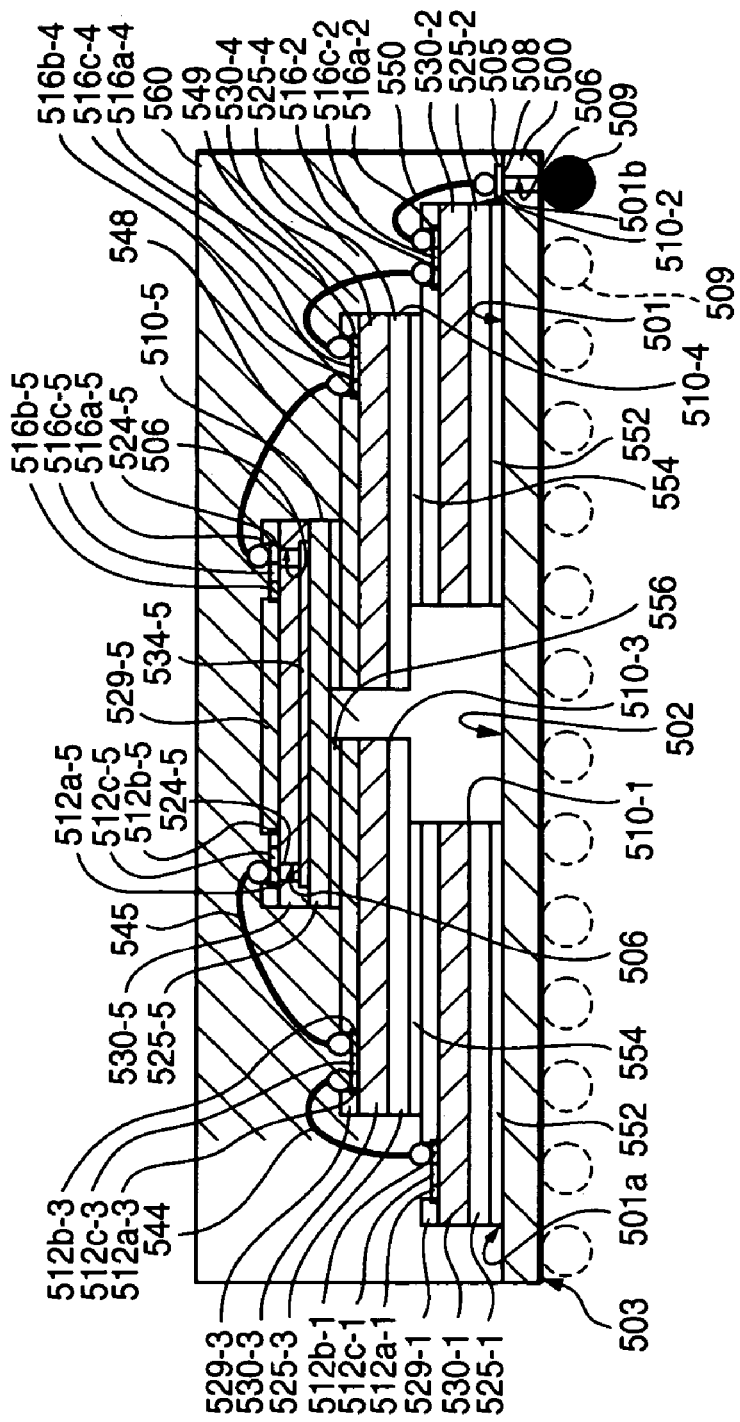
FIG. 18 shows an example of packaging of the semiconductor chips according to the fifth embodiment of the present invention.

FIG. 18 illustrates a constituent example of package, in which the semiconductor device 5000 described with reference to FIG. 16 and FIG. 17 by a sealing resin. Further, FIG. 18 is a pattern diagram for showing a cut surface of the semiconductor device 5000 taken on the same position as FIG. 17A.

Since the constituent elements and the manufacturing processes of the package example of the semiconductor device according to the fifth embodiment are substantially identical with the first embodiment that has been already described, its detailed explanation is herein omitted.

According to the semiconductor device 5000 of the present embodiment, it is only described that five semiconductor chips 510 are laminated, however, two to four semiconductor chips may be laminated.

According to the semiconductor device of the fifth embodiment, in addition to the effects obtained from the semiconductor device of the fourth embodiment, more semiconductor chips can be laminated, and this makes it possible to obtain highly integrated semiconductor chips and a highly functional semiconductor device.

5-3. Operation

Here, with reference to FIG. 16 and FIG. 17 again, the operation of the semiconductor device 5000 will be described.

According to the semiconductor device 5000 of the present embodiment, the signals are outputted to the external device through ten paths. With respect to the case that the signals are inputted in the semiconductor chip 510, as same as the first embodiment, its explanation is herein omitted.

1) First Path

A signal A generated in a circuit element range 525-1 of the first semiconductor chip 510-1 is outputted to a main electrode pad 512-1, namely, the first main electrode pad 512a-1 via a wired structure 530-1.

The signal A that is outputted to the first partial main electrode pad 512a-1 will be outputted to the first electrode 504 of the substrate 500 via the first bonding wire 542.

The signal A that is outputted to the first bonding pad 504 will be outputted to an external terminal 509 via an embedded via 508.

2) Second Path

A signal B that is generated in a circuit element range 525-3 of the third semiconductor chip 510-3 will be outputted to a main electrode pad 512-3, namely, first and second partial main electrode pads 512a-3 and 512b-3 via a wired structure 530-3.

The signal B that is outputted to the first partial main electrode 512a-3 will be outputted to a main electrode pad 512-1 of the first semiconductor chip 510-1, namely, the first and second partial main electrodes 512a-1 and 512b-2 via the second bonding wire 544.

The signal B that is outputted to the main electrode 512-1 will be outputted to the first bonding pad 504 of the substrate 500 via the first bonding wire 542.

The signal B that is outputted to the first bonding pad 504 will be outputted to the external terminal 509 via the embedded via 508.

3) Third Path

A signal C that is generated in a circuit element range 525-5 of the fifth semiconductor chip 510-5 will be outputted to a main electrode pad 512-5, namely, the first and second partial main electrodes 512a-5 and 512b-5 via a wired structure 530-5.

The signal C outputted to the main electrode pad 512a-5 will be outputted to the main electrode pad 512-3 of the third semiconductor chip 510-3, namely, the first and second partial main electrode pads 512a-3 and 512b-3 via a third bonding wire 545.

The signal C outputted to the main electrode pad 512-3 will be outputted to the main electrode pad 512-1 of the second semiconductor chip 510-1 namely, the first and second partial main electrode pads 512a-2 and 512b-2 via the second bonding wire 544.

The signal C outputted to the main electrode pad 512-1 will be outputted to the first bonding pad 504 of the substrate 500 via the first bonding wire 542.

The signal C that is outputted to the first bonding pad 504 will be outputted to the external terminal 509 via the embedded via 508.

4) Fourth Path

A signal D that is generated in the circuit element range 525-1 of the first semiconductor chip 510-1 will be outputted to the main electrode pad 512-1, namely, the first and second partial main electrodes 512a-1 and 512b-1 via the wired structure 530-1.

The signal D outputted to the first main electrode pad 512-1 will be outputted to the main electrode pad 512-3 of the third semiconductor chip 510-3, namely, the first and second partial main electrode pads 512a-3 and 512b-3 via the second bonding wire 544.

The signal D outputted to the main electrode pad 512-3 will be outputted to the main electrode pad 512-5 of the fifth semiconductor chip 510-5, namely, the first and second partial main electrode pads 512a-5 and 512b-5 via the third bonding wire 545.

Consequently, the signal D outputted to the main electrode pad 512-5 will be outputted to the second electrode pad 516-5 via an interconnection 534-5 that is connected to the main electrode pad 512-5.

The signal D outputted to the second electrode pad 516-5 will be outputted to the second electrode pad 516-4 of the fourth semiconductor chip 510-4, namely, the first and second partial electrode pads 516a-4 and 516b-4 via the fourth bonding wire 548.

The signal D outputted to the second partial electrode pad 516-4 will be outputted to the second electrode pad 516-2 of the second semiconductor chip 510-2, namely, the first and second partial electrode pads 516a-2 and 516b-2 via the fifth bonding wire 549.

The signal D outputted to the second partial electrode pad 516-2 will be outputted to the second bonding pad 505 of the substrate 500 via the sixth bonding wire 550.

The signal D outputted to the second bonding pad 505 will be outputted to the external terminal 509 via the embedded via 508.

5) Fifth Path

A signal E that is generated in the circuit element range 525-3 of the first semiconductor chip 510-3 will be outputted to the main electrode pad 512-3, namely, the first and second partial main electrodes 512a-3 and 512b-3 via the wired structure 530-3.

The signal E outputted to the main electrode pad 512-3 will be outputted to the main electrode pad 512-5 of the fifth semiconductor chip 510-5, namely, the first and second partial main electrode pads 512a-5 and 512b-5 via the third bonding wire 545.

Consequently, the signal E outputted to the main electrode pad 512-5 will be outputted to the second electrode pad 516-5 via an interconnection 534-5 that is connected to the main electrode pad 512-5.

The signal E outputted to the second electrode pad 516-5 will be outputted to the second electrode pad 516-4 of the fourth semiconductor chip 510-4, namely, the first and second partial electrode pads 516a-4 and 516b-4 via the fourth bonding wire 548.

The signal E outputted to the second partial electrode pad 516-4 will be outputted to the second electrode pad 516-2 of the second semiconductor chip 510-2, namely, the first and second partial electrode pads 516a-2 and 516b-2 via the fifth bonding wire 549.

The signal E outputted to the second partial electrode pad 516-2 will be outputted to the second bonding pad 505 of the substrate 500 via the sixth bonding wire 550.

The signal E outputted to the second bonding pad 505 will be outputted to the external terminal 509 via the embedded via 508.

6) Sixth Path

A signal F that is generated in the circuit element range 525-5 of the fifth semiconductor chip 510-5 will be outputted to the main electrode pad 512-5, namely, the first and second partial main electrodes 512a-5 and 512b-5 via the wired structure 530-5.

Consequently, the signal F outputted to the main electrode pad 512-5 will be outputted to the second electrode pad 516-5 via the interconnection 534-5 that is connected to the main electrode pad 512-5.

The signal F outputted to the second electrode pad 516-5 will be outputted to the second electrode pad 516-4 of the fourth semiconductor chip 510-4, namely, the first and second partial electrode pads 516a-4 and 516b-4 via the fourth bonding wire 548.

The signal F outputted to the second partial electrode pad 516-4 will be outputted to the second electrode pad 516-2 of the second semiconductor chip 510-2, namely, the first and second partial electrode pads 516a-2 and 516b-2 via the fifth bonding wire 549.

The signal F outputted to the second partial electrode pad 516-2 will be outputted to the second bonding pad 505 of the substrate 500 via the sixth bonding wire 550.

The signal F outputted to the second bonding pad 505 will be outputted to the external terminal 509 via the embedded via 508.

7) Seventh Path

A signal G that is generated in a circuit element range 525-4 of the fourth semiconductor chip 510-4 will be outputted to a main electrode pad 512-4, namely, first and second partial main electrodes 512a-4 and 512b-4 via a wired structure 530-4.

The signal G outputted to the main electrode pad 512-4 will be outputted to the second electrode pad 516-4 via an interconnection 534-4 that is connected to the main electrode pad 512-4.

The signal G outputted to the second partial electrode pad 516-4 will be outputted to the second electrode pad 516-2 of the second semiconductor chip 510-2, namely, the first and second partial electrode pads 516a-2 and 516b-2 via the fifth bonding wire 549.

The signal G outputted to the second electrode pad 516-2 will be outputted to the second bonding pad 505 of the substrate 500 via the sixth bonding wire 550.

The signal G outputted to the second bonding pad 505 will be outputted to the external terminal 509 via the embedded via 508.

8) Eighth Path

A signal H that is generated in a circuit element range 525-2 of the second semiconductor chip 510-2 will be outputted to the second electrode pad 516-2 via an interconnection 534-2 that is connected to a main electrode pad 512-2.

The signal H outputted to the second electrode pad 516-2 will be outputted to the second bonding pad 505 of the substrate 500 via the sixth bonding wire 550.

The signal H outputted to the second bonding pad 505 will be outputted to the external terminal 509 via the embedded via 508.

9) Ninth Path

A signal I that is generated in the circuit element range 525-2 of the second semiconductor chip 510-2 will be outputted to the main electrode pad 512-2, namely, the first and second partial main electrodes 512a-2 and 512b-2 via the wired structure 530-2.

The signal I outputted to the main electrode pad 512-4 will be outputted to the second electrode pad 516-2 via an interconnection 534-2 that is connected to the main electrode pad 512-2.

The signal I outputted to the second partial electrode pad 516-2 will be outputted to the second electrode pad 516-4 of the fourth semiconductor chip 510-4, namely, the first and second partial electrode pads 516a-4 and 516b-4 via the fifth bonding wire 549.

The signal I outputted to the second electrode pad 516-4 will be outputted to the second electrode pad 516-5 of the fifth semiconductor chip 510-5 via the fourth bonding wire 548.

Consequently, the signal I outputted to the second electrode pad 516-5 will be outputted to the main electrode pad 512-5, namely, the first and second partial main electrode pads 512a-5 and 512b-5 via the interconnection 534-5 that is connected to the second electrode pad 516-5.

The signal I outputted to the main electrode pad 512a-5 will be outputted to the main electrode pad 512-3 of the third semiconductor chip 510-3, namely, the first and second partial main electrode pads 512a-3 and 512b-3 via the third bonding wire 545.

The signal I outputted to the main electrode pad 512-3 will be outputted to the main electrode pad 512-1 of the first semiconductor chip 510-1, namely, the first and the second partial main electrode pads 512a-2 and 512b-2 via the second bonding wire 544.

The signal I outputted to the main electrode pad 512-1 will be outputted to the first bonding pad 504 of the substrate 500 via the first bonding wire 542.

The signal I that is outputted to the first bonding pad 504 will be outputted to the external terminal 509 via the embedded via 508.

10) Tenth Path

A signal J that is generated in the circuit element range 525-4 of the fourth semiconductor chip 510-4 will be outputted to the main electrode pad 512-4, namely, the first and second partial main electrodes 512a-4 and 512b-4 via the wired structure 530-4.

The signal J outputted to the main electrode pad 512-4 will be outputted to the second electrode pad 516-4 via the interconnection 534-4 that is connected to the main electrode pad 512-4.

The signal J outputted to the second electrode pad 516-4 will be outputted to the second electrode pad 516-5 of the fifth semiconductor chip 510-5 via the fourth bonding wire 548.

Consequently, the signal J outputted to the second electrode pad 516-5 will be outputted to the main electrode pad 512-5, namely, the first and second partial main electrode pads 512a-5 and 512b-5 via the interconnection 534-5 that is connected to the second electrode pad 516-5.

The signal J outputted to the main electrode pad 512a-5 will be outputted to the main electrode pad 512-3 of the third semiconductor chip 510-3, namely, the first and second partial main electrode pads 512a-3 and 512b-3 via the third bonding wire 545.

The signal J outputted to the main electrode pad 512-3 will be outputted to the main electrode pad 512-1 of the first semiconductor chip 510-1, namely, the first and the second partial main electrode pads 512a-2 and 512b-2 via the second bonding wire 544.

The signal J outputted to the main electrode pad 512-1 will be outputted to the first bonding pad 504 of the substrate 500 via the first bonding wire 542.

The signal J that is outputted to the first bonding pad 504 will be outputted to the external terminal 509 via the embedded via 508.

The semiconductor chip according to the present invention can be preferably applied to so-called multichip package that is configured in such a manner that the plural semiconductor chips are superimposed. Depending on such a configuration, the outputted signals can be outputted as allocated in two directions.

In addition, according to the semiconductor chip of the present invention, since the bonding wire can be made shorter, the electric short circuit due to the contact of the bonding wires each other can be effectively prevented. Accordingly, it is possible to provide a semiconductor device with a high reliability.

What is claimed is:

1. A semiconductor chip with a rectangular main surface and a functional element comprising:
    a first side composing said main surface;
    a second side composing said main surface, wherein the second side is opposite to said first side;
    a main electrode pad group composed of a plurality of main electrode pads, wherein said plurality of main electrode pads is arranged on said main surface along said first side;
    a first electrode pad group composed of a plurality of first electrode pads, which is located between said first side and said main electrode pad group with a first distance, wherein said plurality of first electrode pads is arranged on said main surface along said first side;
    a second electrode pad group composed of a plurality of second electrode pads, which is located between said second side and said main electrode group with a second distance that is longer than said first distance, wherein said plurality of second electrode pads is arranged on said main surface along said second side;
    a plurality of first interconnections, wherein each first interconnection is connected between one of the main electrode pads and one of the first electrode pads; and
    a plurality of second interconnections, wherein each second interconnection is connected between one of the main electrode pads and one of the second electrode pads,
    wherein a main electrode pad connecting to a first electrode pad and a main electrode pad connecting to a second electrode pad are arranged alternately.

2. The semiconductor chip according to claim 1, wherein said first interconnections and said second interconnections are provided on said main surface of said semiconductor chip.

3. The semiconductor chip according to claim 1, wherein said first interconnections and said second interconnections are provided within said semiconductor chip.

4. The semiconductor chip according to claim 3, wherein any one or both of said first interconnections and said second interconnections have a multi-layer wired structure.

5. The semiconductor chip according to claim 1, wherein any one or both of said first and second interconnections are formed within a same wired layer.

6. The semiconductor chip according claim 1, wherein said semiconductor chip is provided with a multi-layer wired structure; and
any one or both of said first and second interconnections has or have the multi-layer wired structure, which comprises a plurality of wired layers connected trough a via embedded in a via hole.

7. The semiconductor chip according to claim 1, wherein circuit elements having weak tolerance to the stress are integrated in the vicinity of a lower side of said main electrode pad group.

8. A semiconductor device comprising:
    a substrate having a first front surface having a first range on which a first bonding pad is formed, a second range on which a second bonding pad is formed, and a third range existing between said first range and said second range;
    a first semiconductor chip having a rectangular main surface and a functional element laminated in said third range of said first front surface; said first semiconductor chip having a first side composing said main surface; a second side composing said main surface, wherein the second side is opposite to said first side; a main electrode pad group composed of a plurality of main electrode pads, wherein said plurality of main electrode pads is arranged on said main surface along said first side; a first electrode pad group composed of a plurality of first electrode pads which is located between said first side and said main electrode pad group with a first distance, wherein said plurality of first electrode pads is arranged on said main surface along said first side; a second electrode pad group composed of a plurality of second electrode pads which is located between said second side and said main electrode group with a second distance which is longer than said first distance, wherein plurality of second electrode pads is arranged on said main surface along said second side; a plurality of first interconnections, wherein each first interconnection is connected between one of the main electrode pads and one of the first electrode pads; and a plurality of second interconnections, wherein each second interconnection is connected between one of the main electrode pads and one of the second electrode pads;
    a second semiconductor chip having the same configuration of the first semiconductor chip and mounted on said first semiconductor chip laminated in said main surface;
    a first bonding wire electrically connecting between said first bonding pad and said first electrode pad of said first semiconductor;
    a second bonding wire electrically connecting between said main electrode pad of said first semiconductor chip and a first electrode pad of said second semiconductor chip, wherein said main electrode pad of said first semiconductor chip is connected with said first electrode pad of said first semiconductor chip through said first interconnection of said first semiconductor chip;
    a third bonding wire electrically connecting between said main electrode pad of said first semiconductor chip and a main electrode pad of said second semiconductor chip, wherein said main electrode pad of said first semiconductor chip is connected with said second electrode pad of said first semiconductor chip through said second interconnection of said first semiconductor chip, and said main electrode pad of said second semiconductor chip is connected with a second electrode pad of said second semiconductor chip through a second interconnection of said second semiconductor chip; and a fourth bonding wire electrically connecting between said second bonding pad and said second electrode pad of said second semiconductor chip;

wherein, in said first semiconductor chip and said second semiconductor chip, said first side of said first semiconductor chip and a first side of said second semiconductor chip are located at the same side, said main surface of said first semiconductor ship and a main surface of said second semiconductor chip are turned in the same direction, and said main electrode pad and said first electrode pad of said first semiconductor chip are located at the outside from a first side of said second semiconductor chip.

9. The semiconductor chip according to claim 8, wherein circuit elements having weak tolerance to the stress are integrated in the vicinity of a lower side of said main electrode pad group.

10. The semiconductor chip according to claim 8, wherein said substrate is provided with a via hole passing through from said first front surface to a second surface of the substrate, a via embedded in the via hole and connected to one of said plurality of first and second bonding pads, and an external terminal connected to said via; and said substrate is further provided wit a sealing portion sealing all bonding wires on said substrate.

* * * * *